(12) United States Patent
Koizumi et al.

(10) Patent No.: US 8,692,363 B2
(45) Date of Patent: Apr. 8, 2014

(54) ELECTRIC PART PACKAGE AND MANUFACTURING METHOD THEREOF

(75) Inventors: Naoyuki Koizumi, Nagano (JP); Masahiro Kyozuka, Nagano (JP); Kenta Uchiyama, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 38 days.

(21) Appl. No.: 13/295,202

(22) Filed: Nov. 14, 2011

(65) Prior Publication Data

US 2012/0119379 A1    May 17, 2012

(30) Foreign Application Priority Data

Nov. 16, 2010 (JP) ................. 2010-256076

(51) Int. Cl.
*H01L 23/02* (2006.01)
(52) U.S. Cl.
USPC ........................... 257/678; 257/687; 257/690
(58) Field of Classification Search
USPC ........................ 257/774, 700, 678, 687, 690
See application file for complete search history.

(56) References Cited

U.S. PATENT DOCUMENTS

| 2007/0007644 A1* | 1/2007 | Zhao et al. ............... 257/707 |
| 2007/0194464 A1* | 8/2007 | Fukuzono ............... 257/791 |
| 2008/0303136 A1 | 12/2008 | Mori et al. |
| 2009/0176334 A1* | 7/2009 | Fan .......................... 438/121 |
| 2010/0044845 A1* | 2/2010 | Funaya et al. ............ 257/685 |

FOREIGN PATENT DOCUMENTS

JP    2008-306071    12/2008

* cited by examiner

*Primary Examiner* — Jae Lee
(74) *Attorney, Agent, or Firm* — IPUSA, PLLC

(57) ABSTRACT

A disclosed electric part package includes a supporting member that includes a first area in which an electric part is arranged, and a second area in which a first opening is positioned, the second area being isolated from the first area; a resin part provided on the supporting member thereby to cover the electric part arranged in the first area, the resin part including an electric terminal exposed in the first opening of the supporting member; and a wiring structure provided on the resin part, the wiring structure being electrically connected to the electric part and the electric terminal of the resin part.

7 Claims, 42 Drawing Sheets

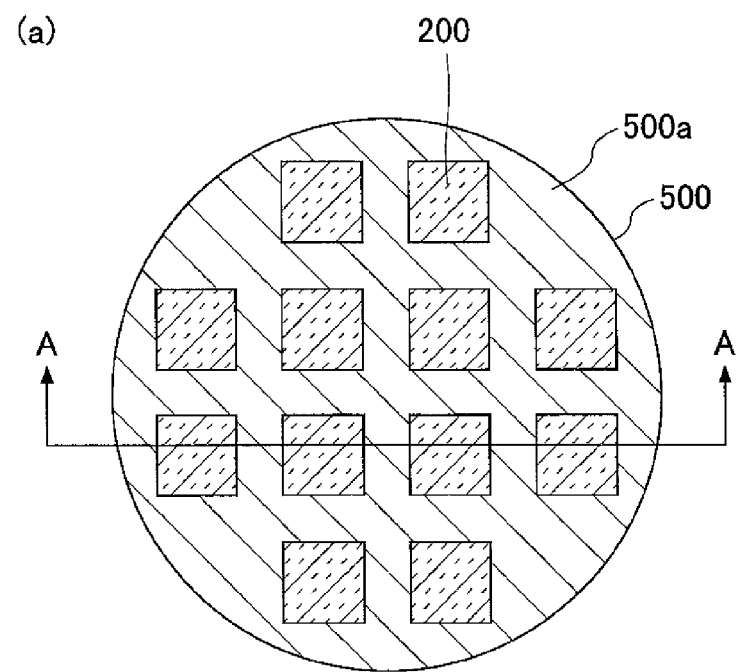
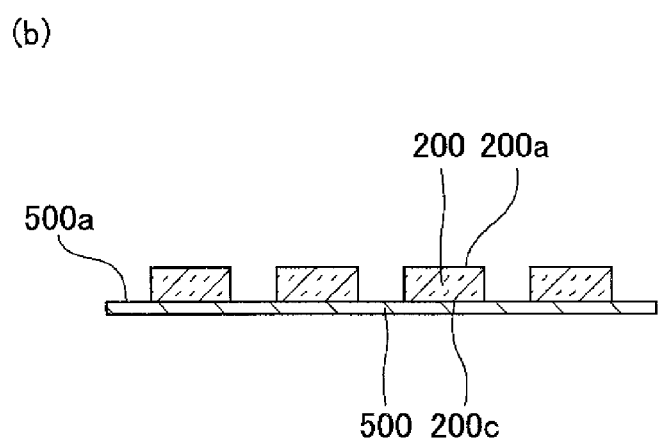
FIG.2 RELATED ART

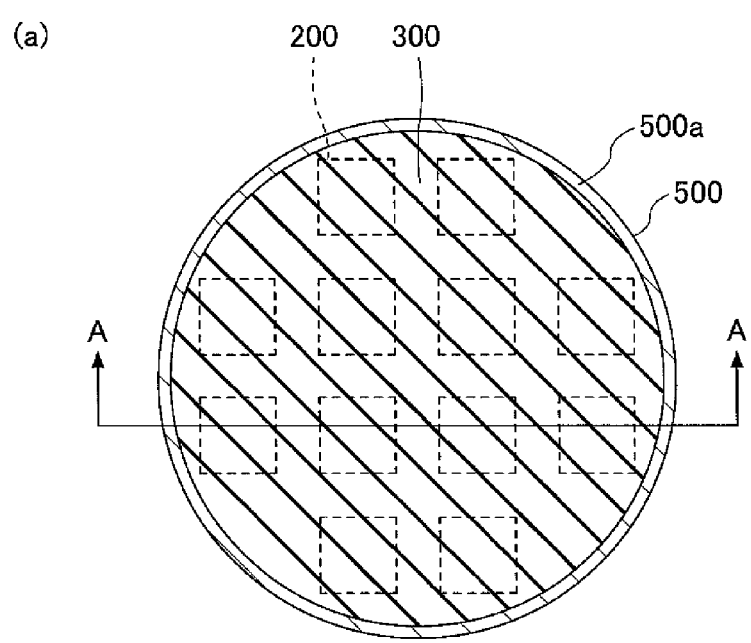
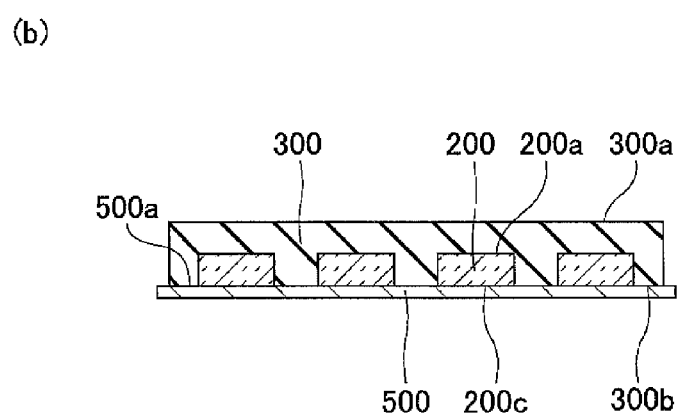
FIG. 3 RELATED ART

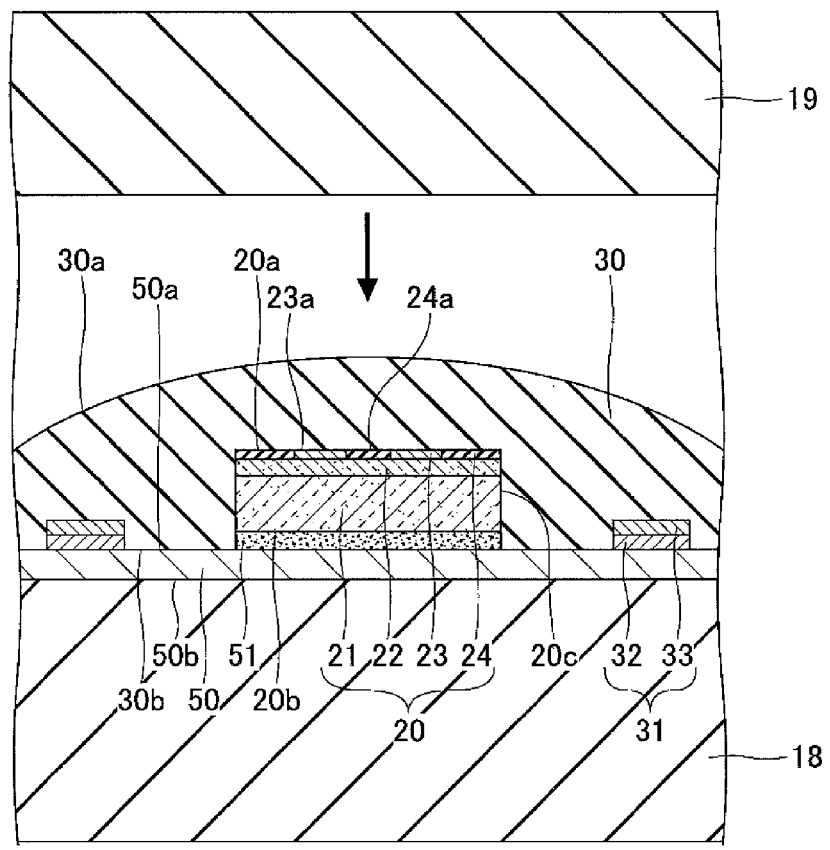
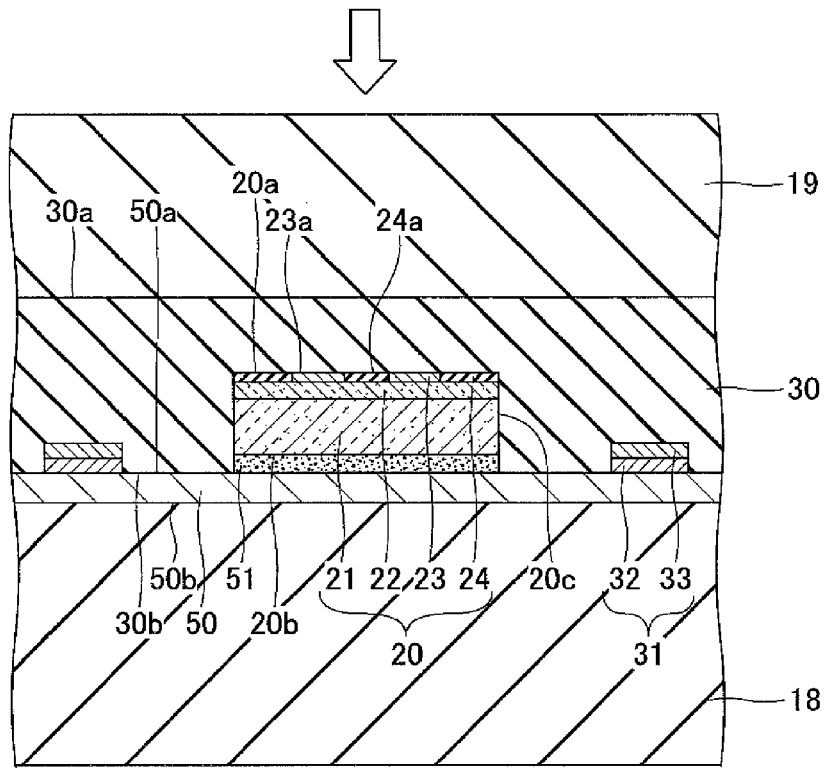
FIG.11

ELECTRIC PART PACKAGE AND MANUFACTURING METHOD THEREOF

CROSS-REFERENCE TO RELATED APPLICATIONS

This application is based upon and claims the benefit of priority of the prior Japanese Patent Application No. 2010-256076, filed on Nov. 16, 2010, the entire contents of which are incorporated herein by reference.

FIELD

The embodiment discussed herein is directed to an electronic part package that includes an electronic part and a resin part with which the electronic part is covered, and a manufacturing method of the same.

BACKGROUND

An electronic part package that has a semiconductor chip and a resin part with which the semiconductor chip is covered has long been known (see Japanese Laid-open Patent Publication No. 2008-306071, for example). An example of such an electronic part package is described in the following.

FIG. 1 is a cross-sectional view exemplifying a conventional electronic part package. Referring to FIG. 1, an electronic part package 100 has a semiconductor chip 200 as an example of an electric part 200, a resin part 300, and a wiring structure 400.

The semiconductor chip 200 has a semiconductor chip main body 210 and electrode pads 220. The semiconductor chip main body 210 is configured so that a semiconductor integrated circuit (not illustrated) or the like is formed on a semiconductor substrate (not illustrated), which is a thin plate made of a semiconductor such as silicon.

The resin part 300 is provided in order to cover a surface 200a and surfaces 200b (side surfaces) of the semiconductor chip 200. An adhesive layer 510 is provided on a surface 200c, which is an opposite surface of the surface 200a of the semiconductor chip 200. Incidentally, the surface 200a may be referred to as a circuit forming surface; the surfaces 200b may be referred to as side surfaces; and the surface 200c may be referred to as a back surface.

The wiring structure 400 is formed by stacking a first wiring layer 410, a second wiring layer 420, a third wiring layer 430, a first insulating layer 440, and a second insulating layer 450.

Each of the wiring layers 410, 420, 430 is electrically connected with electrode pads 220 of the semiconductor chip 200 by way of vias 300x, 440x, 450x that go through the resin part 300 or the insulating layers 440, 450.

A solder resist layer 460 is formed on the second insulation layer 450 and covers the third wiring layer 430. The solder resist layer 460 has openings 460x, and parts of the third wiring layer 430 are exposed in the openings 460x. The third wiring layer 430 exposed in the openings 460x of the solder resist layer 460 functions as electrode pads connected with a motherboard or the like.

FIGS. 2 through 5 illustrate a manufacturing process of the electronic part package. The same or corresponding reference symbols are given to the same or corresponding parts or members, and repetitive explanation may be omitted. Sections (a) of FIGS. 2 and 3 are plan views, and sections (b) are cross-sectional views taken along A-A lines of the corresponding sections (a) of FIGS. 2 and 3. A conventional manufacturing method of the electric part package is explained with reference to FIGS. 2 and 3. Incidentally, the electrode pads 220 and the adhesive layer 510 are omitted in FIGS. 2 and 3.

First, the two or more semiconductor chips 200 are placed on a surface 500a of a supporting member 500 so that the surfaces 200c (back surfaces) oppose (or come in contact with) the surface 500a of the supporting member 500 in a process illustrated in FIG. 2. The adhesive layers 510 are formed in advance on the surfaces 200c of the semiconductor chips 200.

Next, the resin part 300 is formed by a compression molding method or the like on the surface 500a of the support member 500 thereby to cover the semiconductor chips 200 in a process illustrated in FIG. 3.

Next, the first wiring layer 410, the first insulating layer 440, the second wiring layer 420, the second insulating layer 450, and the solder resist layer 460 that has the third wiring layer 430 and the openings 460x are formed in this order on a surface 300a of the resin part 300, in a process illustrated in FIG. 4.

Next, the support member 500 is removed in a process illustrated in FIG. 5. With this, the surface 200c of the semiconductor chip 200, where the adhesive layer 510 is formed, is exposed from the surface 300b of the resin part 300.

Then, solder balls 470 (FIG. 1) are formed on the third wiring layer 43 exposed in the openings 460x of the solder resist layer 460. Next, the structure manufactured so far is cut along lines C illustrated in FIG. 5. As a result, the electric part package 100 illustrated in FIG. 1 is obtained.

SUMMARY

While the electric part package 100 in progress has sufficient stiffness and is not warped after the wiring structure 400 is formed as illustrated in FIG. 4, the electric part package 100 may lose stiffness or may be warped after the supporting member 500 is removed as illustrated in FIG. 5.

The present invention has been made in view of the above, and provides an electric part package that is capable of maintaining sufficient stiffness and reducing warpage of the electric part package, and a manufacturing method of the same.

According to a first aspect of the present invention, an electric part package includes a supporting member that includes a first area in which an electric part is arranged, and a second area in which a first opening is positioned, the second area being isolated from the first area; a resin part provided on the supporting member thereby to cover the electric part arranged in the first area, the resin part including an electric terminal exposed in the first opening of the supporting member; and a wiring structure provided on the resin part, the wiring structure being electrically connected to the electric part and the electric terminal of the resin part.

According to a second aspect of the present invention, a manufacturing method of an electric part package includes arranging an electric part in a first area of a supporting member; providing a resin part on the supporting member thereby to cover the electric part arranged in the first area; providing a wiring structure on the resin part, the wiring structure being electrically connected to the electric part; and forming a first opening in a second area of the supporting member, the second area being isolated from the first area.

BRIEF DESCRIPTION OF DRAWINGS

FIG. 2 is an explanatory view for explaining a related art manufacturing method of an electric part package (Part 1);

FIG. 3 is an explanatory view for explaining a related art manufacturing method of an electric part package (Part 2);

FIG. 11 is an explanatory view for explaining a manufacturing method of an electric part package, according to the first embodiment of the present invention (Part 4);

DESCRIPTION OF EMBODIMENT(S)

According to an embodiment of the present invention, there is provided an electric part package that is capable of maintaining sufficient stiffness and reducing warpage of the electric part package, and a manufacturing method of the same.

Referring to the accompanying drawings, embodiments according to the present invention are explained. In plan views and bottom views of the accompanying drawings, the same hatchings as used in cross-sectional views may be used in order to clearly illustrate the corresponding parts or members illustrated in the plan views, the bottom views, and the cross-sectional views.

First Embodiment

A Structure of an Electric Part Package According to a First Embodiment

Figure 6:
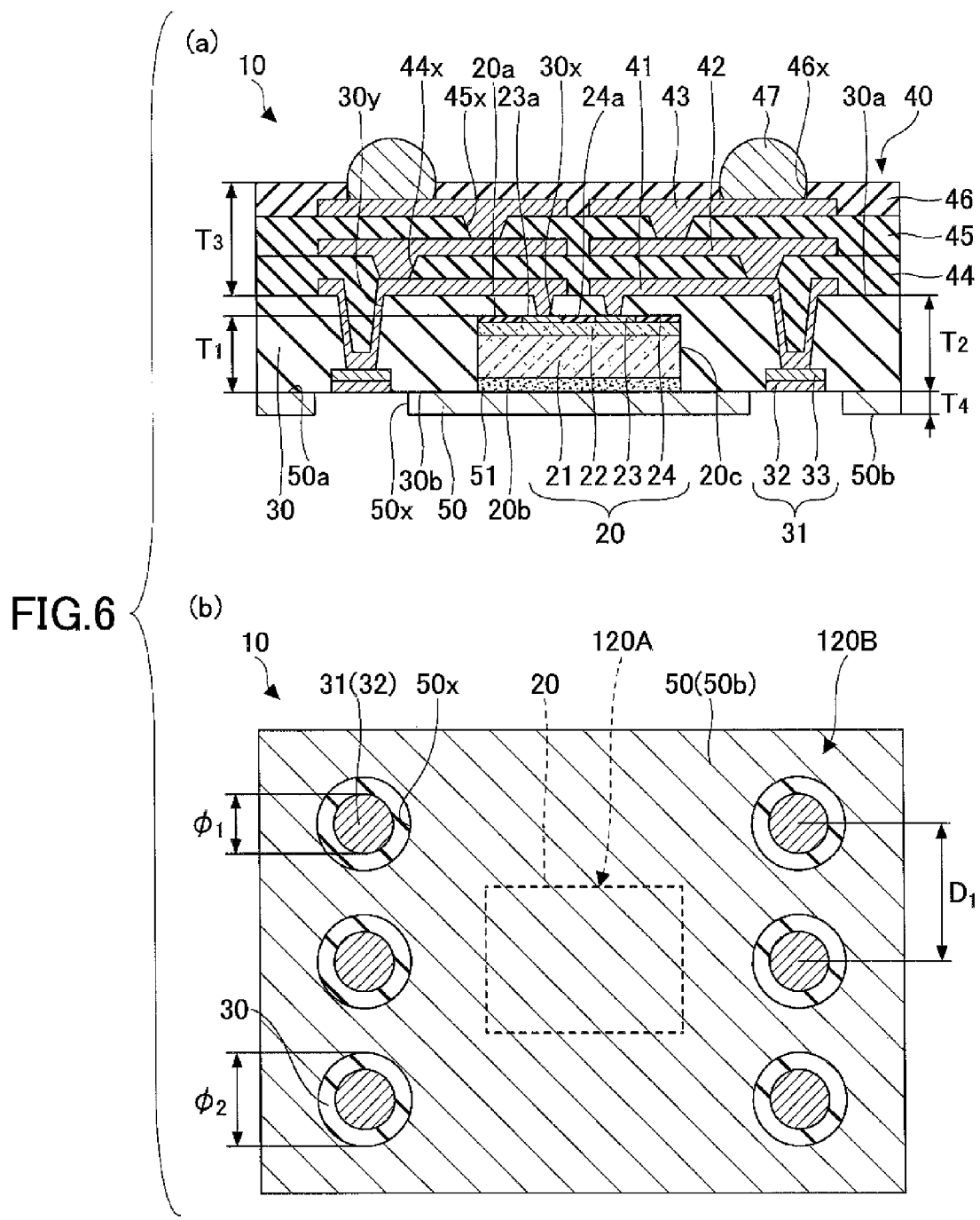
FIG. 6 illustrates a configuration of an electric part package according to a first embodiment of the present invention (Part 1)

FIG. 6 illustrates an electric part package according to a first embodiment of the present invention. Sections (a) and (b) of FIG. 6 are a cross-sectional view, and a bottom view, respectively. Referring to FIG. 6, an electronic part package 10 has an electronic part 20, a resin part 30, a wiring structure 40, and a support member 50. Incidentally, a semiconductor chip 20 is exemplified as the electric part 20 in the following explanation.

The semiconductor chip 20 has a semiconductor substrate 21, a semiconductor integrated circuit 22, two or more electrode pads 23, and a protection film 24. For example, a size of the semiconductor chip 20 (in plan view) may be about 5 mm×10 mm. A thickness T1 of the semiconductor chip 20 may be from 50 to 800 μm, or 800 μm in this embodiment. Incidentally, a surface 20a on which the electrode pads 23 are formed in the semiconductor chip 20 may be referred to as a circuit forming surface in the following.

For instance, the semiconductor substrate 21 may be silicon (Si) substrate. The semiconductor integrated circuit 22 has diffusion layers, insulating layers, vias, wirings, and the like (not illustrated). The electrode pads 23 are provided on the semiconductor integrated circuit 22, and electrically connected with semiconductor integrated circuit 22. For instance, the electrode pads 23 may be made of aluminum (Al) or the like. Alternatively, the electrode pads 23 may be configured of a two-layer film of a copper (Cu) layer and an Al layer formed on the Cu layer, a three-layer film of a Cu layer, a Si layer, and an Al layer stacked in this order, or the like.

The protection film 24 is provided on the semiconductor integrated circuit 22. The protection film 24 is a film that protects the semiconductor integrated circuit 22, and may be called a passivation film. For instance, a silicon nitride (SiN) film and a phospho-silicate glass (PSG) film, or the like may be used as the protection film 24. In addition, the protection film 24 may be configured of a multilayer film of the SiN film and/or the PSG film and a polyimide film formed thereon.

The resin part 30 is provided in order to cover a circuit forming surface 20a and surfaces 20c (side surfaces) of the semiconductor chip 20. A surface 30a of the resin part 30, the surface 30a being on the side of the wiring structure 40, is made flat. A surface 30b opposing the surface 30a of the resin part 30 forms a substantially identical surface together with the surface 20b of the semiconductor chip 20. A thickness T2 of the resin part 30 may be, for example, 900 μm or more.

Electrode terminals 31 are formed in the surface 30b of the resin part 30. The electric terminals 31 may be configured of a first metal layer 32 and a second metal layer 33 that are stacked in this order in a direction from the supporting member 50 to the wiring structure 40. As an example of the first metal layer 32, there are a nickel/gold layer formed by stacking a nickel (Ni) layer on the second metal layer 33 and a gold (Au) layer on the Ni layer, a nickel/palladium/gold layer formed by stacking a Ni layer, a palladium (Pd) layer, and an Au layer in this order on the second metal layer 33, and the like. As an example of the second metal layer 33, there are a Cu layer and the like. Incidentally, a diameter of the electrode terminal 31 may be, for example, 200 μm, and spacing between the two adjacent electrode terminals 31 may be, for example, 400 μm.

The wiring structure 40 has a first wiring layer 41, a second wiring layer 42, a third wiring layer 43, a first insulating layer 44, and a second insulating layer 45.

The wiring structure 40 is formed on the surface 30a of the resin part 30. A thickness T3 of the wiring structure 40 may be about, for instance, 3-200 μm, or 50 μm in this embodiment. Namely, the thickness T3 of the wiring structure 40 (3-200 μm) is less than the thickness T1 of the semiconductor chip 20 (50-800 μm).

The first wiring layer 41 is formed on the surface 30a of the resin 30, and is electrically connected with the electrode pads 23 of the semiconductor chip 20 by way of via holes 30x that go through the resin part 30. In addition, the first wiring layer 41 is electrically connected with the electrode terminals 31 formed in the surface 30b of the resin part 30 by way of the via holes 30y that go through the resin part 30.

The first insulation layer 44 is formed on the surface 30a of the resin part 30 in order to cover the first wiring layer 41. The second wiring layer 42 is formed on the first insulation layer 44, and electrically connected with the first wiring layer 41 by way of first via holes 44x that go through the first insulation layer 44. The second insulation layer 45 is formed on the first insulation layer 44 in order to cover the second wiring layer 42. The third wiring layer 43 is formed on the second insulation layer 45, and electrically connected with the second wiring layer 42 byway of second via holes 45x that go through the second insulation layer 45.

The solder resist layer 46 is formed on the second insulation layer 45 in order to cover the third wiring layer 43. The solder resist layer 46 has openings 46x, and parts of the third wiring layer 43 are exposed in the openings 46x. The third wiring layer 43 exposed in the openings 46x of the solder resist layer 46 functions as electrode pads connected with a mother board or the like.

A metal layer may be formed on the third wiring layer 43 exposed in the openings 46x of the solder resist layer 46. As an example of the metal layer, there are a Ni/Au layer formed by stacking a Ni layer and an Au layer in this order, a Ni/Pd/Au layer formed by stacking a. Ni layer, a Pd layer, and an Au layer in this order, and the like. In addition, an OSP (Organic Solderability Preservative) processing may be applied to the third wiring layer 43 exposed in the openings 46x of the solder resist layer 46 in place of forming the metallic layer.

Solder balls 47 are mounted on the third wiring layer 43 exposed in the openings 46x of the solder resist layer 46.

The supporting member 50 is formed to cover the face 30b of the resin part 30 and the surface 20b (back surface) of the semiconductor chip 20. A thickness T4 of the support member 50 may be about, for instance, 10-200 μm, or 50 μm in this embodiment.

The support member 50 may have a shape of a flat plate, specifically a plan view shape of a rectangle or a square.

Incidentally, the semiconductor chip 20 is arranged on a chip arrangement area 120A of the surface 50a of the support member 50. Specifically, the semiconductor chip 20 is arranged on the support member 50 by using an adhesive layer 51.

The support member 50 may be made of various metals including Cu, Ni, 42-alloy (an alloy of Ni and iron (Fe) containing 42 wt % of Ni), aluminum, and various ceramic materials.

Openings 50x are formed in an area 120B, which is isolated from the chip arrangement area 120A (or an area excluding the chip arrangement area 120A), of the support member 50 so that the electrode terminals 31 are exposed. Namely, the openings 50x are formed at positions in the supporting member 50 that overlap the electrode terminals 31 formed in the surface 30b of the resin part 30.

In addition, the opening 50x may have a plan view shape of a circle. When a diameter ø1 of the electrode terminal 31 is about 200 μm and the pitch D1 of the two adjacent electrode terminals 31 is about 400 μm as stated above, an inner diameter φ2 of the opening 50x may be, for example, 300 μm.

Figure 7:
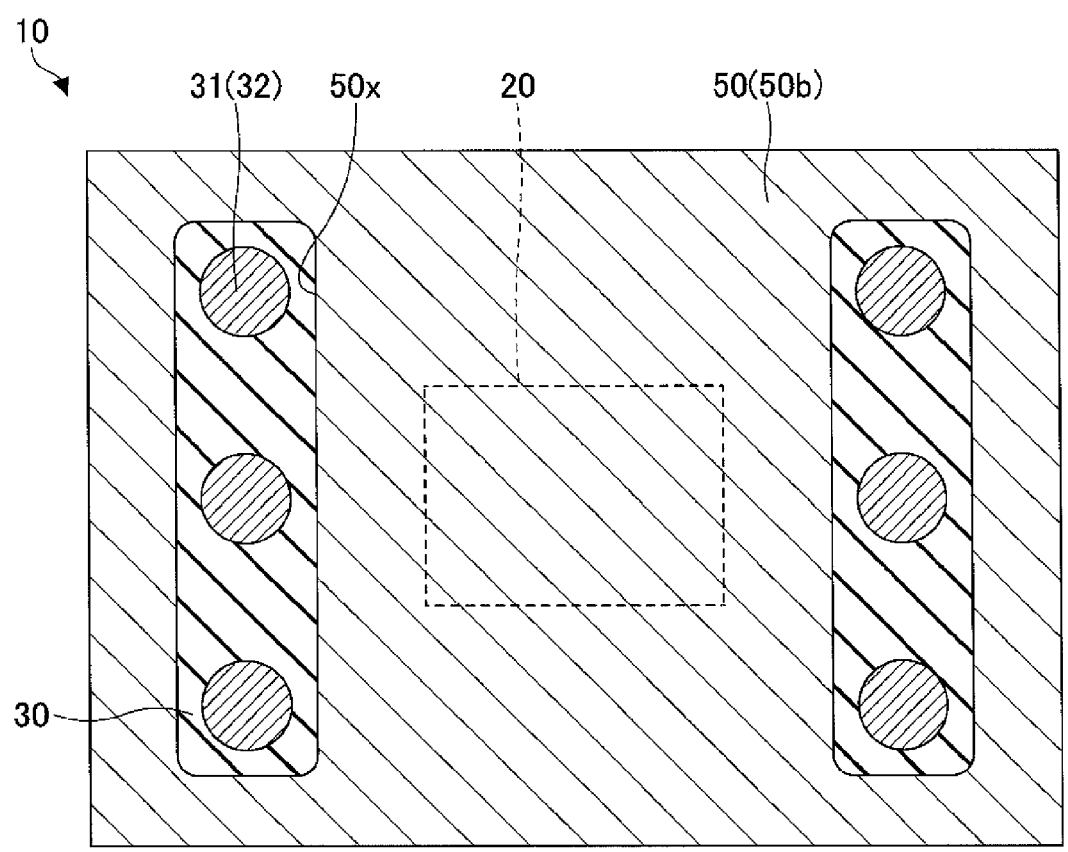
FIG. 7 illustrates a configuration of an electric part package according to a first embodiment of the present invention (Part 2)

Incidentally, the openings 50x may be formed in order to include the corresponding electrode terminals 31, as illustrated in FIG. 7, or one opening 50x may be formed in order to include two or more electrode terminals 31, as illustrated in FIG. 7.

Figure 8:
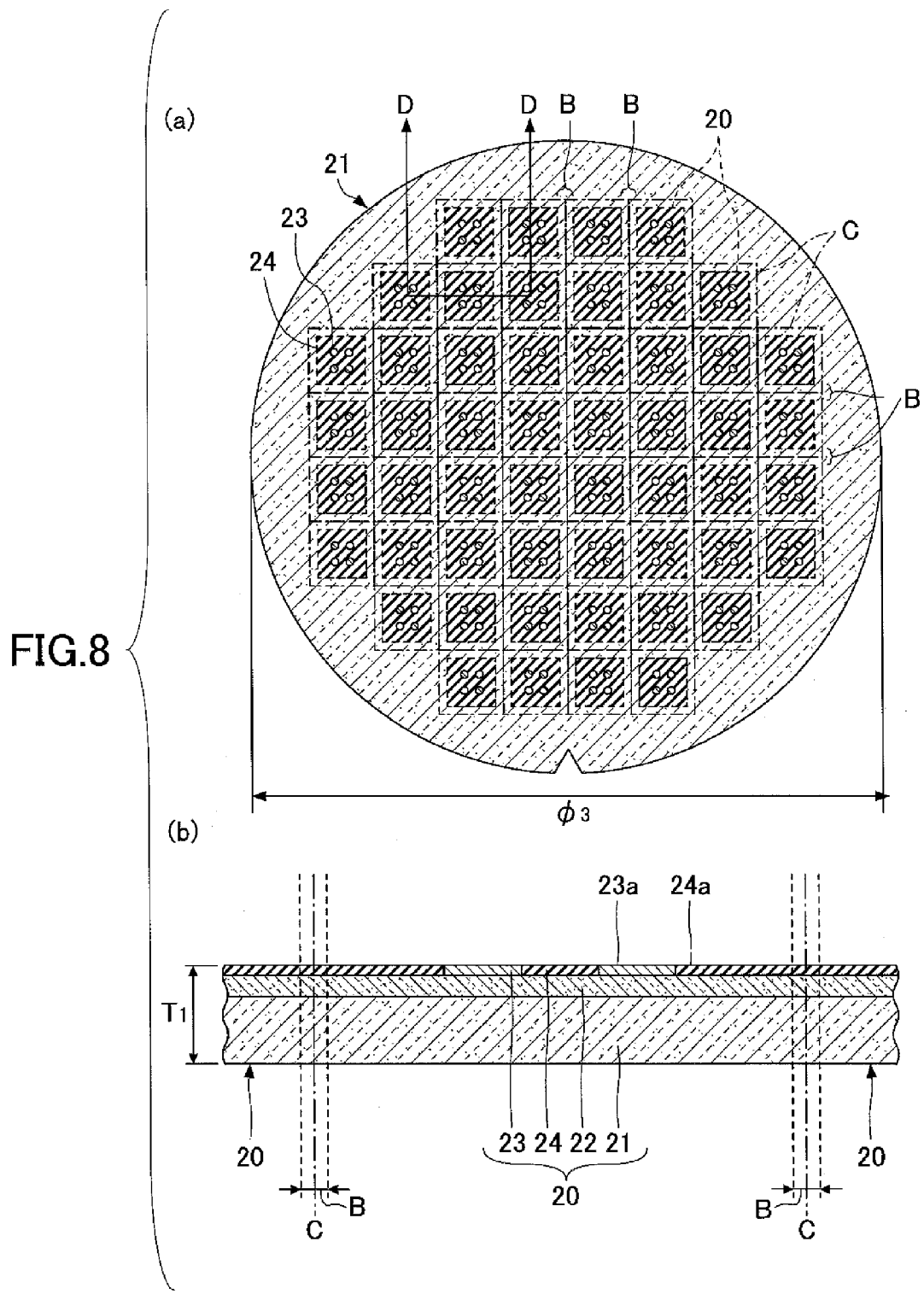
FIG. 8 is an explanatory view for explaining a manufacturing method of an electric part package, according to the first embodiment of the present invention (Part 1)
Figure 9:
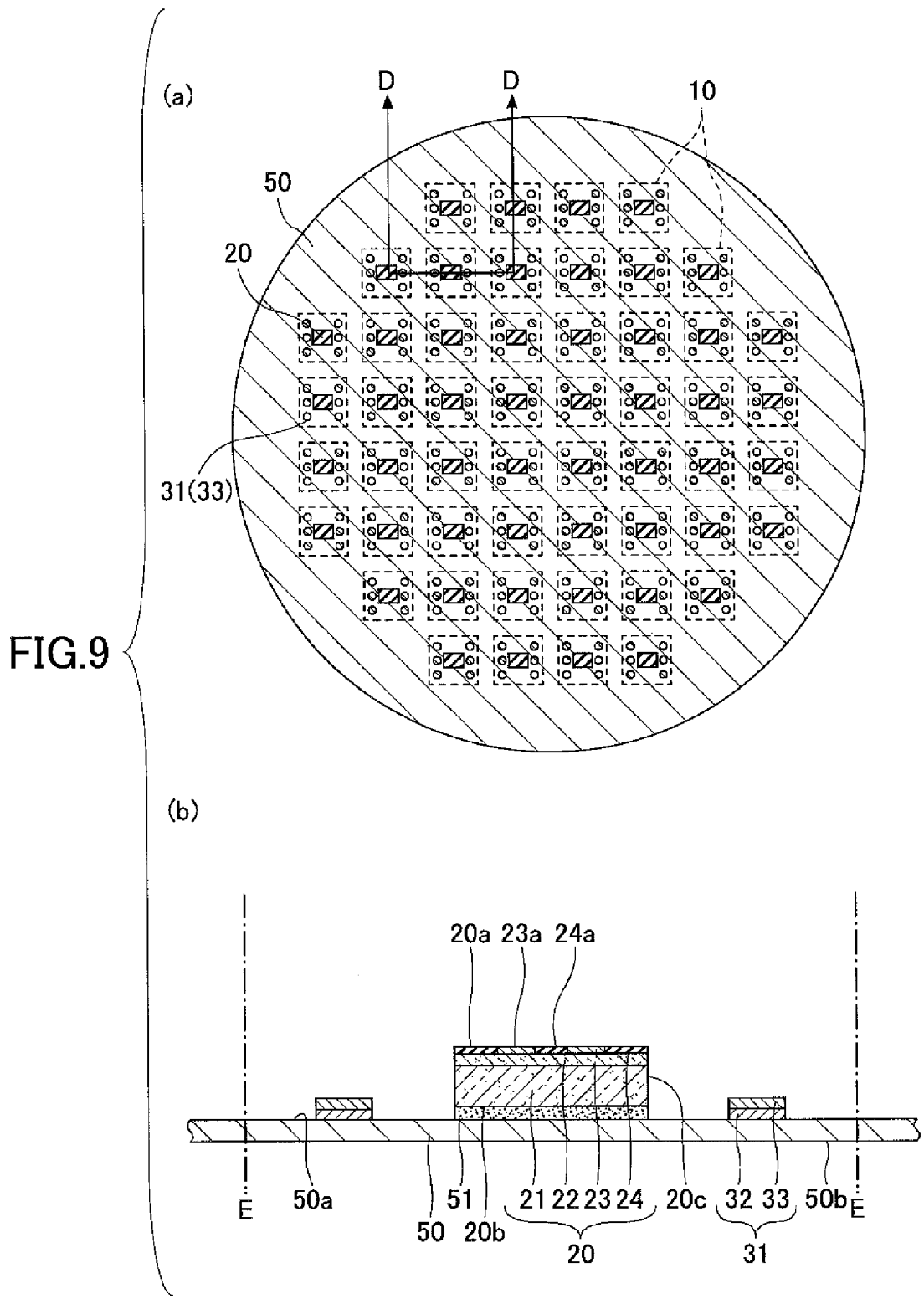
FIG. 9 is an explanatory view for explaining a manufacturing method of an electric part package, according to the first embodiment of the present invention (Part 2)
Figure 10:
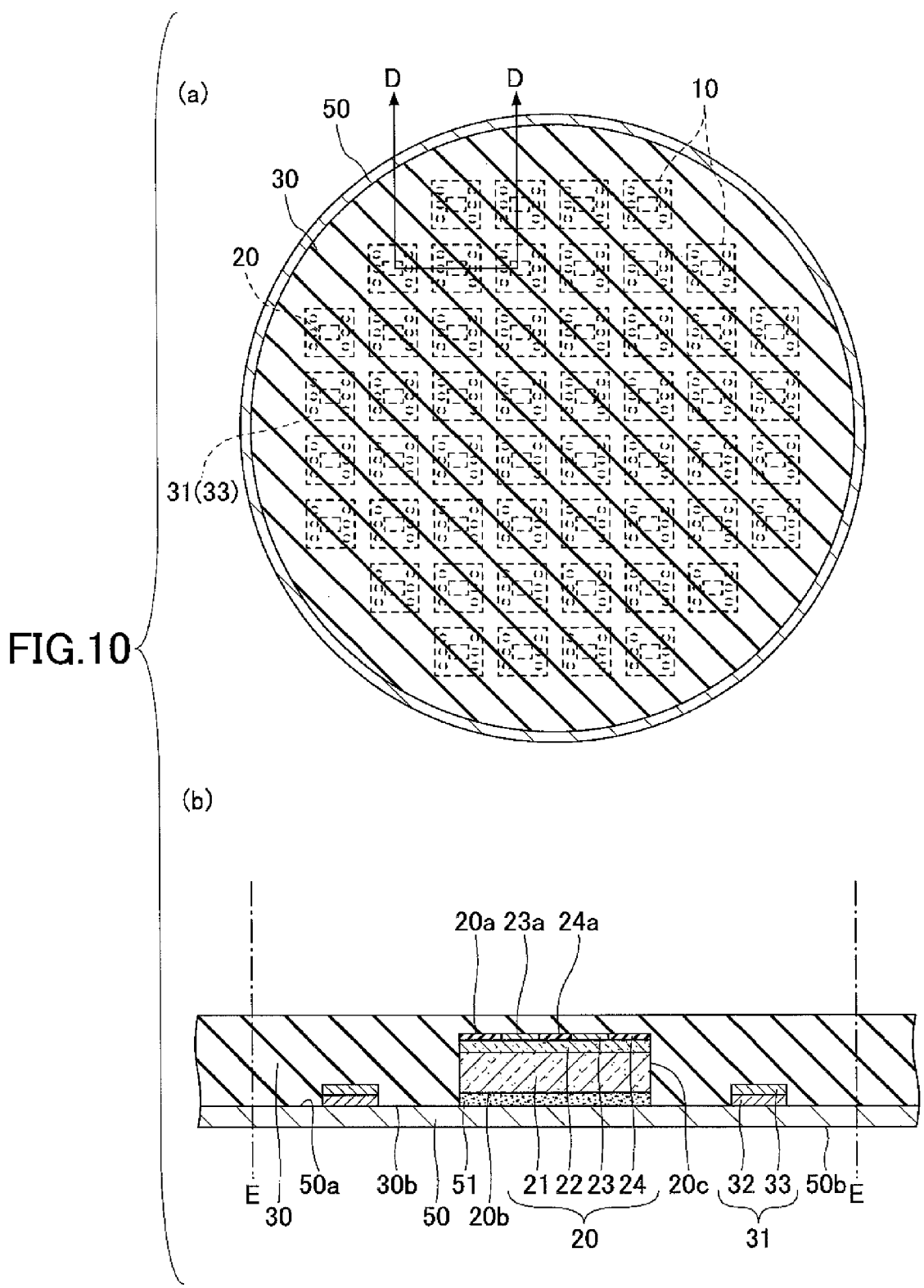
FIG. 10 is an explanatory view for explaining a manufacturing method of an electric part package, according to the first embodiment of the present invention (Part 3)

A Manufacturing Method of the Electric Part Package According to the First Embodiment Next, a manufacturing method of the electric part package according to the first embodiment of the present invention is explained. FIGS. 8 through 17 illustrate corresponding process steps of the manufacturing method of the electric part package according to the first embodiment of the present invention. In these drawings, the same or corresponding reference symbols are given to the same or corresponding parts or members, and repetitive explanation may be omitted. Incidentally, sections (a) of FIGS. 8 through 10 are plan views, and sections (b) of FIGS. 8 through 10 are cross-sectional views taken along D-D lines in the corresponding plan views. In addition, lines E indicate positions where a structure illustrated in FIG. 17 is severed (diced) in a process step illustrated in FIG. 17.

First, the semiconductor wafer 21 (semiconductor substrate 21) that has two or more semiconductor chips 20 is prepared in a process step illustrated in FIG. 8. In this drawing, reference symbols B in the semiconductor wafer 21 indicate positions where the semiconductor wafer 21 is severed into two or more semiconductor chips 21 (the areas are referred to as scribe areas B, hereinafter), and reference symbols C indicate dicing lines along which a dicing blade or the like dices the semiconductor wafer 21. A diameter φ3 of the semiconductor wafer 21 may be, for example, 200 mm. In addition, a thickness of the semiconductor wafer 21 may be, for example, about 50 through 800 μm, or 800 μm in this embodiment. Each of the semiconductor chips 20 has the structure explained above.

Next, the supporting member 50 is prepared, and the two or more semiconductor chips 20 are arranged on the surface 50a of the prepared supporting member 50, in a process step illustrated in FIG. 9. As stated above, the supporting member 50 may have a plan view shape of a rectangle or square.

As the supporting member 50, a supporting member formed of a metal such as Cu, Ni, Al or the like (or a metal plate or a metal foil) is prepared. In this embodiment, the supporting member 50 formed of a Cu metal plate or foil is prepared in the following manner.

First, a photoresist pattern having predetermined openings corresponding to the electrode terminals 31 is formed on the supporting member 50. Then, the electrode terminals 31 are formed by an electroplating method using the supporting member 50 as a plating power feeding layer. Specifically, the Au layer, the Pd layer, and the Ni layer are electroplated in this order on the supporting member 50 exposed in the openings of the photoresist pattern, thereby to form the first metal layer 32. Next, the Cu layer is electroplated on the first metal layer 32 by the electroplating method, thereby to form the second metal layer 33. Subsequently, the photoresist layer is removed, and thus the electrode terminals 31 are made.

Next, the semiconductor wafer 21 illustrated in FIG. 8 is severed along the dicing lines C by the dicing blade, there to obtain the two or more semiconductor chips 20. Then, the semiconductor chips 20 are arranged on the surface 50a of the supporting member 50 so that the surface 20b of each of the semiconductor chips 20 opposes (comes in contact with) the surface 50a of the supporting member 50.

Incidentally, the adhesive layer 51 is formed in advance on the surfaces 20b of the semiconductor chips 20. Specifically, the adhesive layer 51 made of a film material is attached on a surface of the semiconductor wafer 21, the surface opposing the surfaces 20b of the semiconductor chips 20, by using a roller laminator before the semiconductor wafer 21 is severed into two or more semiconductor chips 20. A thickness of the adhesive layer 51 may be, for example, from 10 to 20 μm.

Then, the semiconductor chips 20 arranged respectively on the surfaces 50a of the supporting members 50 are pressed on from the above, so that the semiconductor chips 20 are fixed face up on the corresponding surfaces 50a of the supporting members 50 with the adhesive layer 51. Spacing of the two adjacent semiconductor chips 20 is arbitrarily determined.

Next, the resin part 30 is formed on the surface 50a of the supporting member 50 by a compressing method thereby to cover the semiconductor chips 20 and the electrode terminals 31 in a process step illustrated in FIG. 11. Specifically, the structure illustrated in FIG. 9 is placed on a lower mold 18, and epoxy resin powder or pellets serving as a raw material of the resin part 30 are placed on the surface 50a of the supporting member 50 thereby to cover the semiconductor chips 20. Next, the powder or pellets are heated to be flowable, and an upper mold 19 is pressed onto the powder or pellets and cooled down thereby to be hardened. With this, the resin part 30 is formed to cover upper surface 23a of electrode pads 23 of the semiconductor chips 20 arranged on the supporting member 50, the circuit forming surface 20a (surface 24a of the protection film 24), and the electrode terminals 31. Heating the powder or pellets may be carried out at, for example, 150° C. for 5 minutes. A thickness T2 of the resin part 30 may be, for example, 900 μm or more.

In addition, the resin part 30 may be formed by stacking resin films made of epoxy- or polyimide-based resin, instead of using the pellets or powder. Specifically, a thermosetting epoxy-based resin film is stacked on the supporting member 50 in order to cover the semiconductor chip 20 and the electrode terminals 31, and then heated and pressed to be hardened under a vacuum environment, thereby to obtain the resin part 30.

Figure 12:
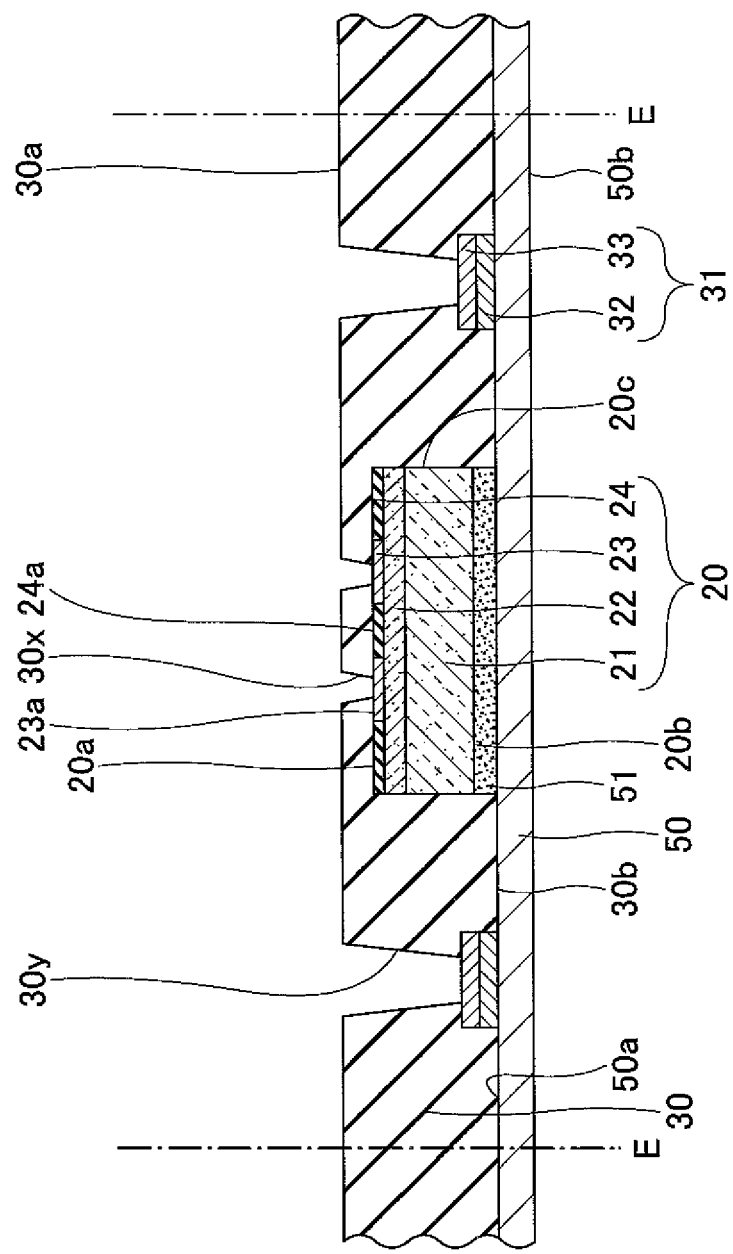
FIG. 12 is an explanatory view for explaining a manufacturing method of an electric part package, according to the first embodiment of the present invention (Part 5)

Next, the via holes 30x that go through the resin part 30 are formed in order to allow the corresponding electrode pads 23 to be exposed in the via holes 30x by employing a laser machining method, in a process step illustrated in FIG. 12. In addition, the via holes 30y that go through the resin part 30 are formed in order to allow the corresponding electrode terminals 31 to be exposed in the via holes 30y by employing the laser machining method, a blast method, or the like.

Figure 13:
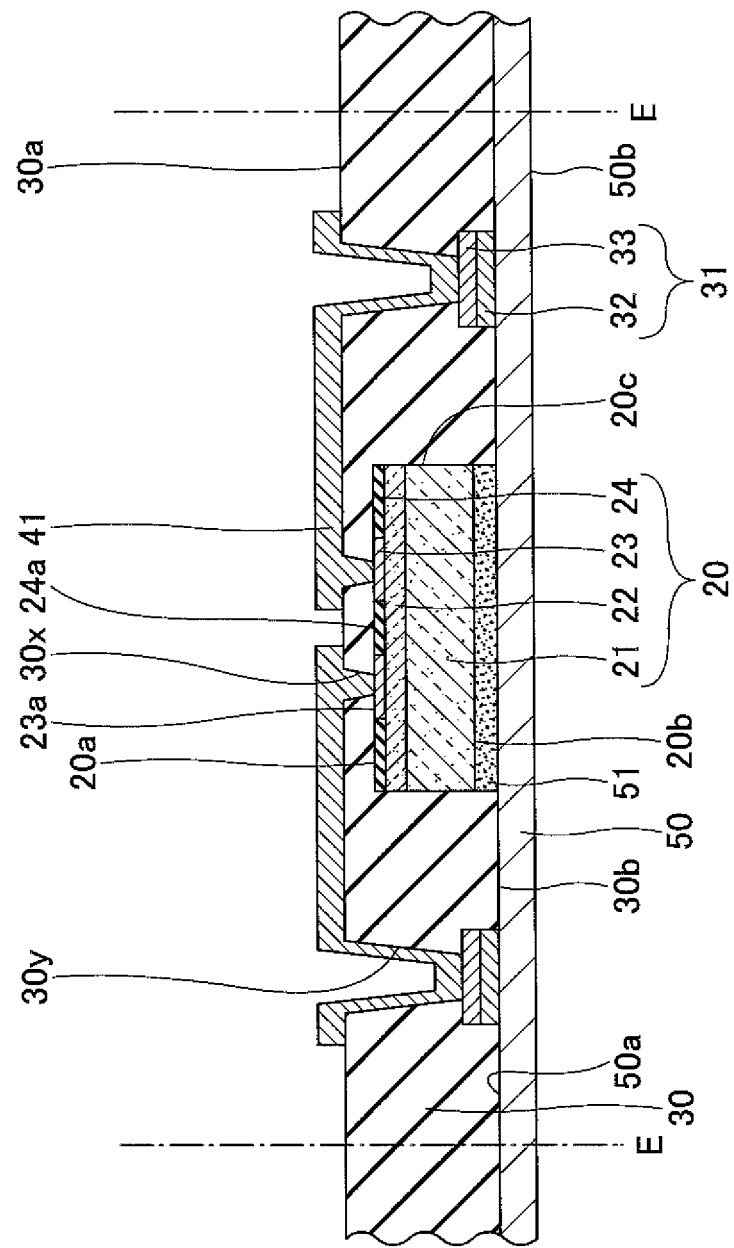
FIG. 13 is an explanatory view for explaining a manufacturing method of an electric part package, according to the first embodiment of the present invention (Part 6)
Figure 14:
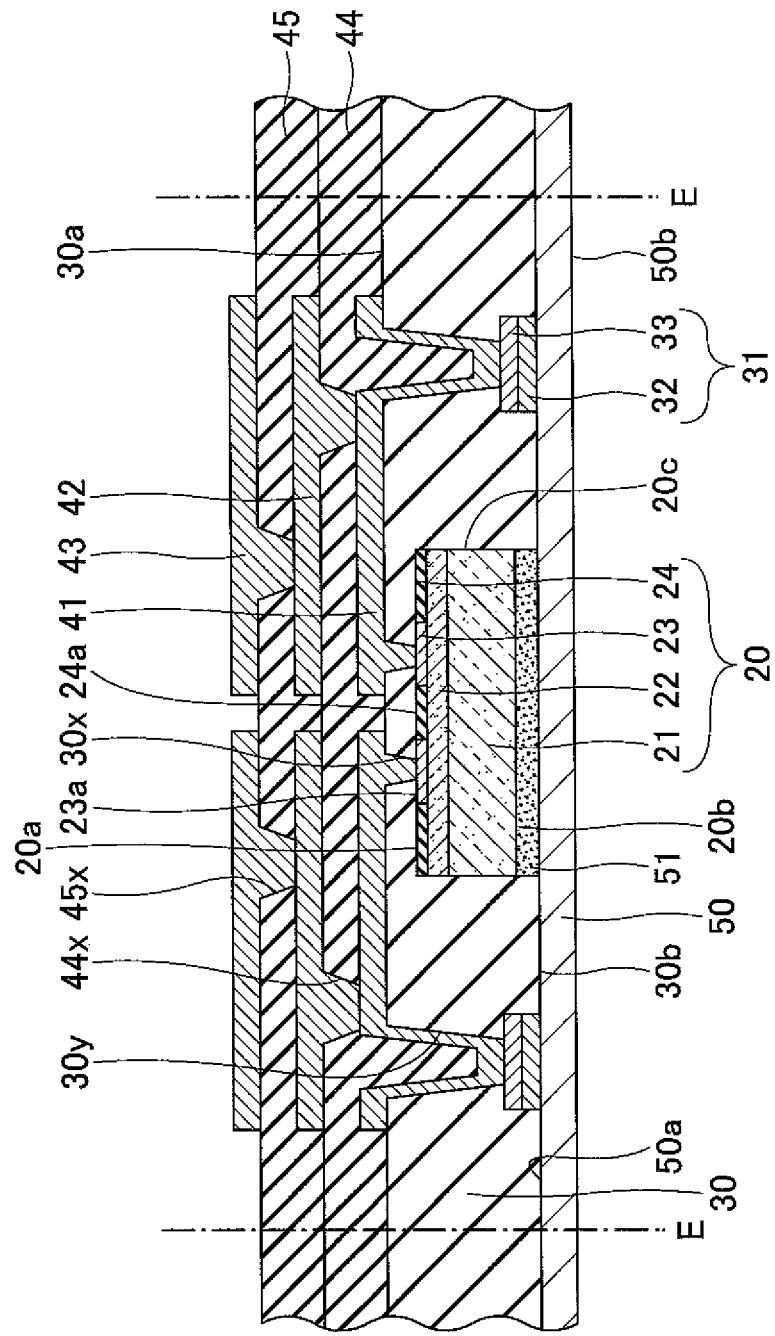
FIG. 14 is an explanatory view for explaining a manufacturing method of an electric part package, according to the first embodiment of the present invention (Part 7)

Next, the wiring structure 40 that is electrically connected to the semiconductor chip 20 is formed on the surface 30a of the resin part 30, in process steps illustrated in FIGS. 13 through 14.

First, the first wiring layer 41 is formed on the surface 30a of the resin part 30 so that the first wiring layer 41 is electrically connected to the electrode pads 23 exposed in the corresponding via holes 30x and the electrode terminals 31 exposed in the corresponding via holes 30y, in a process step illustrated in FIG. 13. The first wiring layer 41 may be formed of, for example, copper (Cu). In addition, the first wiring layer 41 is formed by, for example, a semi-additive method. Incidentally, the first wiring layer 41 includes via plugs formed within the corresponding via holes 30x, via plugs formed within the corresponding via holes 30y, and a wiring pattern formed on the resin part 30.

The semi-additive method of forming the first wiring layer 41 is explained in the following. First, a Cu seed layer (not illustrated) is formed on inner wall surfaces of the via holes 30x, 30y, the electrode pads 23 exposed in the via holes 30x, the electrode terminal 31 exposed in the via holes 30y, and the surface 30a of the resin part 30, by a non-electrolytic plating method or a sputtering method. Next, a photoresist layer (not illustrated) having openings that define the first wiring layer 41 is formed on the Cu seed layer (not illustrated). Then, a Cu layer (not illustrated) is formed in the openings of the photoresist layer by the electroplating method that employs the Cu seed layer as a plating power feeding layer. Subsequently, the photoresist layer is removed, and the Cu seed layer is etched by using the Cu layer as an etching mask, thereby obtaining the first wiring layer 41.

In addition, a metal layer (Cu layer) is provided on the inner wall surface of the via holes 30y thereby to form the via plugs, and a metal layer (Cu layer) is filled in the via holes 30x thereby to form the via plugs.

Incidentally, the first wiring layer 41 may be formed by various wiring forming methods including a subtracting method or the like, rather than the semi-additive method.

Next, the first insulating layer 44 is formed on the surface 30a of the resin part 30 to cover the first wiring layer 41, in a process step illustrated in FIG. 14. The first insulating layer 44 may be farmed of resin materials such as epoxy- or polyimide-based resin. The first insulating layer 44 may be formed, for example, by laminating a resin film on the first wiring layer 41 and the surface 30a of the resin part 30, and pressing the resin film at a temperature of about 190° C. thereby to harden the resin film.

Then, the first via holes 44x that go through the first insulating layer 44 are formed so that the first wiring layer 41 is exposed in the first via holes 44x by employing the laser machining method or the like. Incidentally, when a photosensitive resin film may be used to form the first insulating layer 44, the first via holes 44x can be formed by a photolithography method. In addition, the first via holes 44x may be formed by patterning a resin film where openings are formed by a screen printing method.

Then, the second wiring layer 42, the third wiring layer 43, and the second insulating layer 45 are formed by repeating similar processes explained above. Specifically, the second wiring layer 42 that is connected to the first wiring layer 41 by way of the first via holes 44x is formed on the first insulating layer 44. The second wiring layer 42 may be formed of, for example, copper (Cu). The second wiring layer 42 is formed, for example, by the semi-additive method. Next, the second insulating layer 45 is formed in order to cover the second wiring layer 42, and then the second via holes 45x are formed in predetermined positions of the second insulating layer 45, the positions being on the second wiring layer 42. Then, the third wiring layer 43 that is connected to the second wiring layer 42 by way of the second via holes 45x is formed on the second insulating layer 45. The third wiring layer 43 may be formed of, for example, copper (Cu). The third wiring layer 43 is formed, for example, by the semi-additive method.

In such a manner, a predetermined built-up wiring layer is formed on the surface 30a of the resin part 30. In the first embodiment, a three layer built-up wiring layer (from the first wiring layer 41 to the third wiring layer 43) is formed. In other embodiments, an n-layer (n: an integer greater than 1) built-up layer may be formed.

In addition, one of the first insulating layer 44 and the second insulating layer 45 may be formed of a thermosetting resin including a stiffener. With this, stiffness of the electric part package can be enhanced. In addition, such a thermosetting resin can contribute to reduction of warpage in the electric part package, while the warpage reduction can be realized by allowing the supporting member 50 to remain as explained later. Incidentally, as the thermosetting resin including the stiffener, a pre-impregnation material made, for example, by using a fiber material such as glass fiber to impregnate epoxy- or polyimide-based resin may be used.

In addition, when the second insulating layer 45, which is the outermost insulating layer, is formed of an insulating material including a stiffener, such as an insulating layer made by using, for example, a glass fiber to impregnate the epoxy- or polyimide-based resin, stiffener members (serving as the second insulating layer 45 and the supporting member 50) are provided on both sides of the electric part package, thereby effectively reducing warpage of the electric part package.

Figure 15:
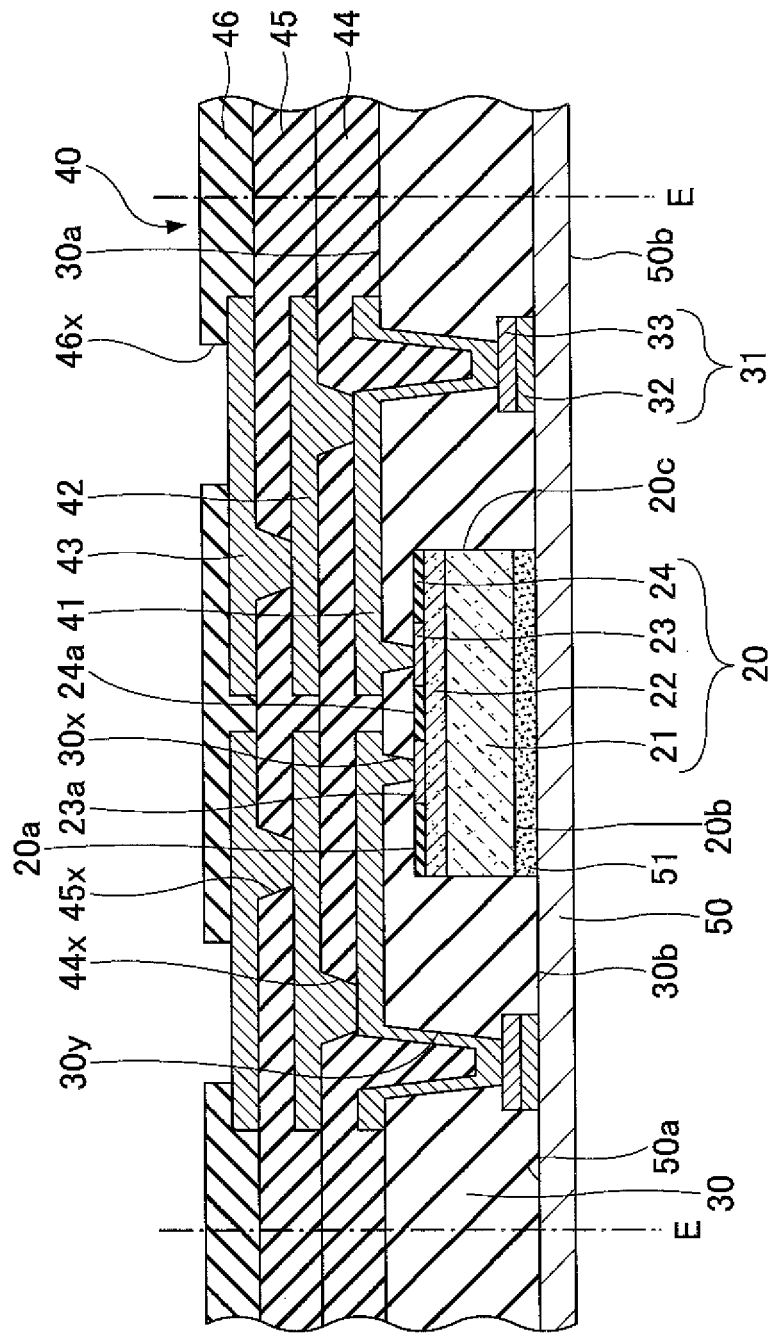
FIG. 15 is an explanatory view for explaining a manufacturing method of an electric part package, according to the first embodiment of the present invention (Part 8)
Figure 16:
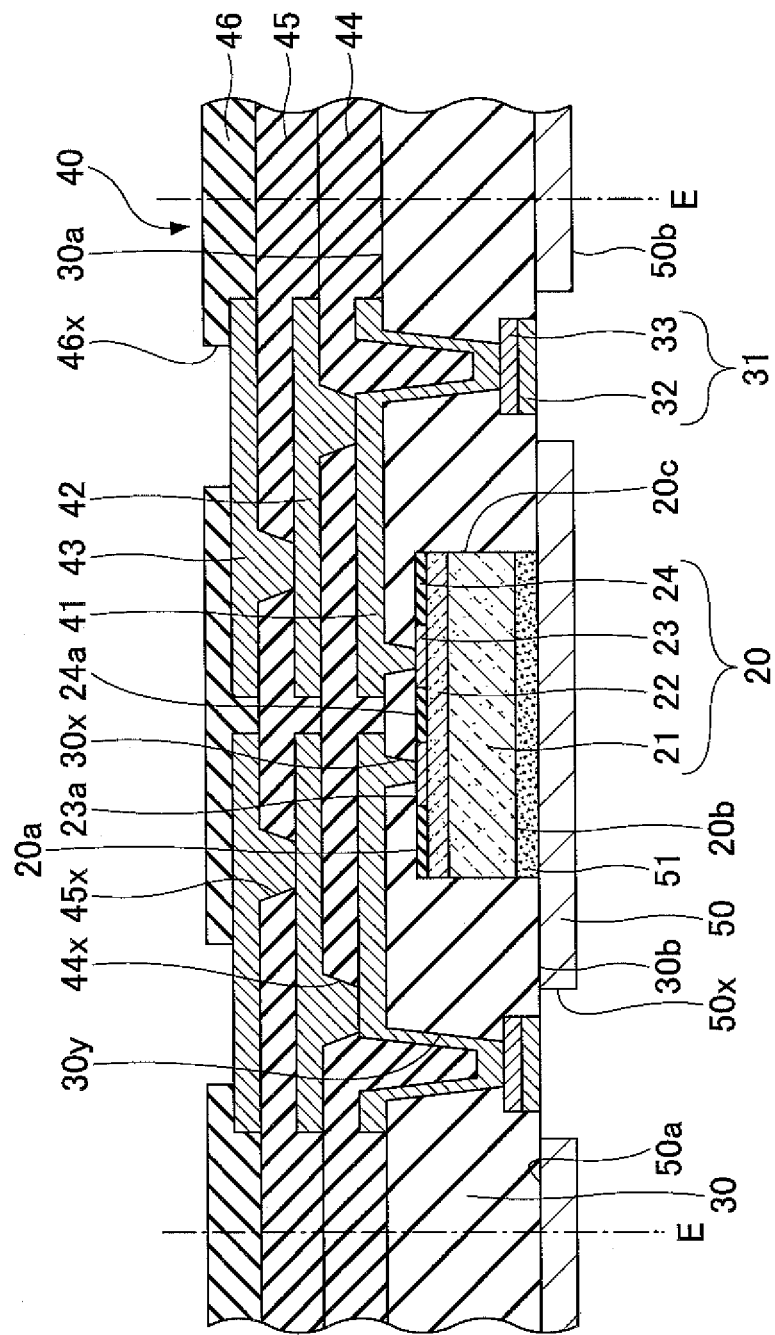
FIG. 16 is an explanatory view for explaining a manufacturing method of an electric part package, according to the first embodiment of the present invention (Part 9)
Figure 17:
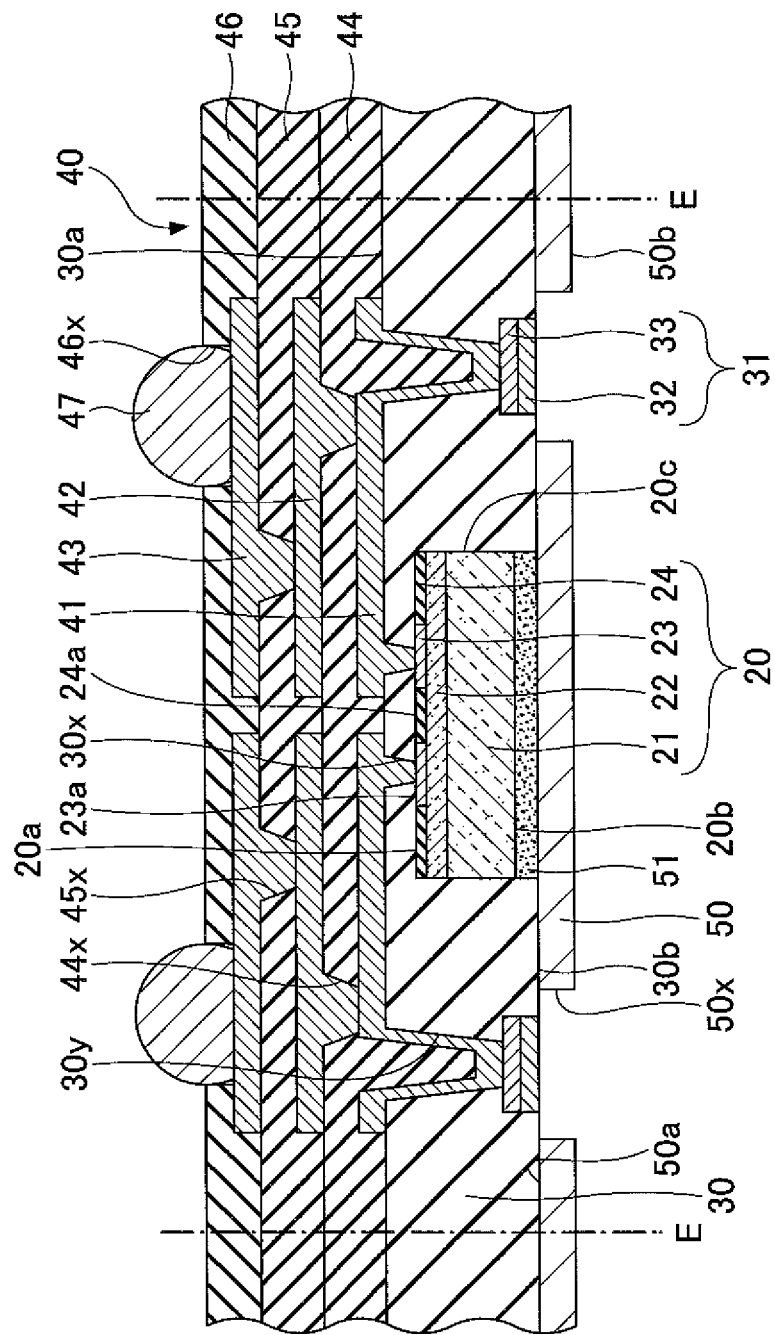
FIG. 17 is an explanatory view for explaining a manufacturing method of an electric part package, according to the first embodiment of the present invention (Part 10)

Next, the solder resist layer 46 is formed by applying solder resist on the second insulating layer 45 in order to cover the third wiring layer 43, in a process step illustrated in FIGS. 15 and 16. Then, the solder resist layer 46 is exposed to exposure light through a predetermined photomask and developed, thereby forming the openings 46x. With this, parts of the third wiring layer 43 are exposed in the corresponding openings 46x of the solder resist layer 46. The solder resist 46 may be formed of, for example, photosensitive resin composites including, for example, epoxy- or polyimide-based resin. In addition, the third wiring layer 43 exposed in the openings 46x of the solder resist 46 function as electrode pads that are connected with a motherboard or the like.

Incidentally, a metal layer may be formed on the third wiring layer 43 exposed in the openings 46x of the solder resist layer 46. The metal layer may be formed, for example, by the non-electrolytic plating method. As an example of the metal layer, there are a Ni/Au layer formed by stacking a Ni layer and an Au layer in this order, a Ni/Pd/Au layer formed by stacking a Ni layer, a Pd layer, and an Au layer in this order, and the like. In addition, an OSP (Organic Solderability Preservative) processing may be applied to the third wiring layer 43 exposed in the openings 46x of the solder resist layer 46 in place of forming the metallic layer.

In addition to the second insulating layer 45, the solder resist layer 46 may be formed of, for example, the thermosetting resin including the stiffener material.

In this case, a resin film made by using, for example, a glass fiber to impregnate epoxy- or polyimide-based resin, is stacked to cover the second insulating layer 45 and the third wiring layer 43, and then heated and pressed to be hardened under a vacuum environment, thereby to form the solder resist layer 46. Then, the openings 46x may be formed, for example, by the laser machining method.

Next, the openings 50x are formed in the supporting member 50 by removing parts of the supporting member 50 so that the electrode terminals 31 are exposed in the corresponding openings 50x, or seen from the side of the supporting member 50. Specifically, a photoresist solution is applied on the surface 50b of the supporting member 50, and the applied photoresist is exposed to exposure light and developed, thereby forming a mask layer having openings that define the corresponding openings 50x. Alternatively, a resist layer is formed by laminating a sheet-like resist (dry film resist), and the formed resist layer is exposed to exposure light and developed, thereby forming a mask layer having openings that define the corresponding openings 50*x*. Then, the supporting member 50 is etched with the mask layer used as an etching mask, thereby forming the openings 50*x*. The supporting member 50 can be etched by aqueous ferric chloride when supporting member 50 is formed of copper (Cu).

The supporting member 50 still remains although parts of the supporting member 50 are removed to form the openings 50*x*. When the supporting member 50 is formed of, for example, a material such as metal or ceramic materials, the supporting member 50 can have a relatively high stiffness, or a relatively high Young's modulus. Therefore, when a thermal expansion coefficient of the insulating layers 44, 45 that constitute the wiring structure 40 is different from that of the semiconductor chip 20, warp of the electric part package 10, which may be caused by shrinkage rates when it is cooled after a heating process, is reduced.

In addition, when the supporting member 50 is formed of various other materials such as metal and ceramic materials, the supporting member 50 can have a thermal expansion coefficient that is closer to that of the insulating layers 44, 45 that constitute the wiring structure 40 than that of the semiconductor chip 20. Therefore, when a thermal expansion coefficient of the insulating layers 44, 45 is greater than that of the semiconductor chip 20, warpage of the electric part package 10, which may be caused by shrinkage rates when it is cooled after a heating process, can be reduced.

Figure 1:
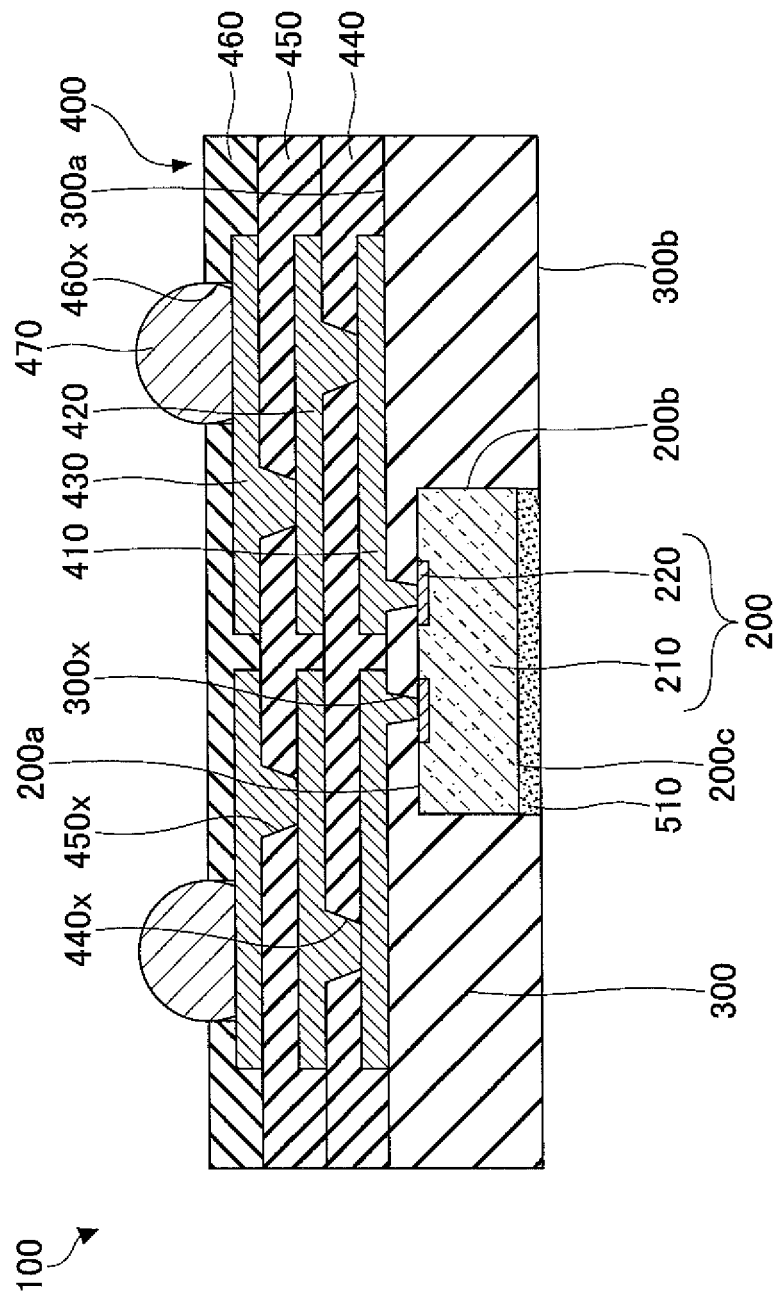
FIG. 1 is a cross-sectional view illustrating a related art electric part package.
Figure 4:
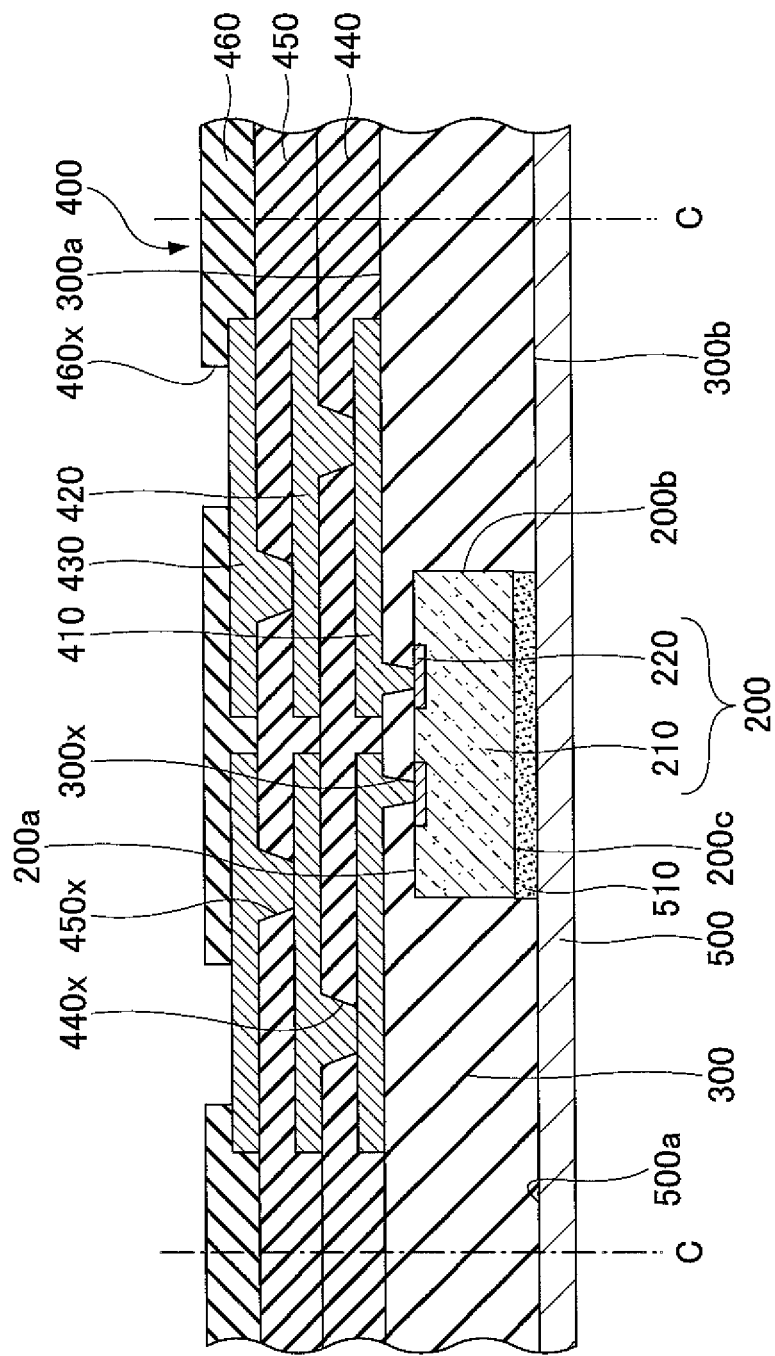
FIG. 4 is an explanatory view for explaining a related art manufacturing method of an electric part package (Part 3)
Figure 5:
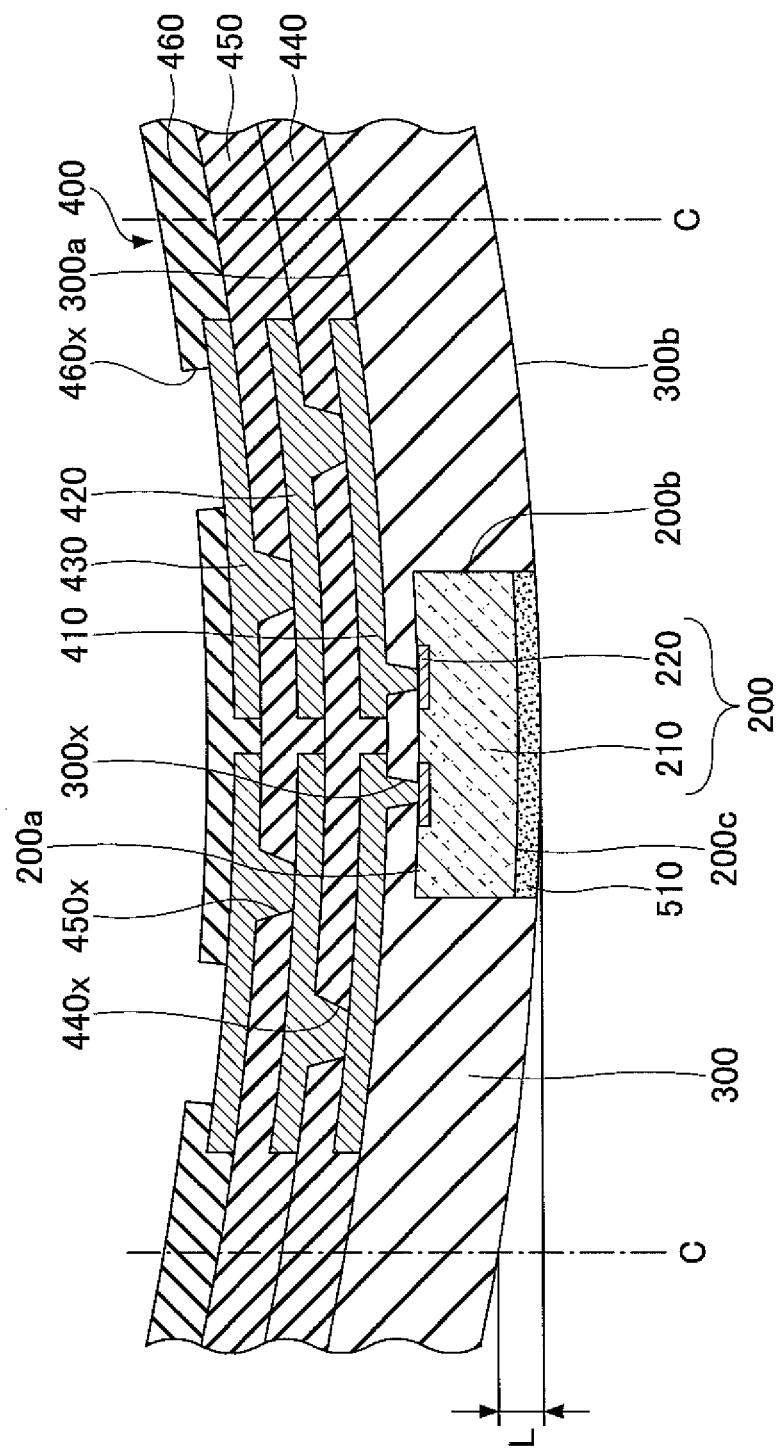
FIG. 5 is an explanatory view for explaining a related art manufacturing method of an electric part package (Part 4)

Specifically, while a warpage amount L in FIG. 5 is about 100 to 200 µm, a warpage amount L is about 20 µm or less in this embodiment.

Next, the solder balls 47 are mounted on the third wiring layer 43 exposed in the openings 46*x* of the solder resist layer 46, in a process step illustrated in FIG. 17.

Then, the structure illustrated in FIG. 17 is severed, for example, along the lines E. With this, the electric part packages 10, one of which is illustrated in FIG. 6, are finished.

As stated, according to the first embodiment of the present invention, the semiconductor chip 20 (electric part) is arranged on the supporting member 50 that is not removed (or deleted). Therefore, warpage of the electric part package, which may be caused by removing the supporting member, can be reduced.

In addition, because the semiconductor chip 20 (electric part) and the resin part 30 are supported by the supporting member 50, stiffness of the electric part package can be enhanced. When various materials including metal such as Cu, Ni, Ni—Fe alloys, ceramic material, or the like are used to form the supporting member 50, mechanical properties such as stiffness of the supporting member 50 are not changed in a temperature range below 300° C. Therefore, stiffness of the electric part package 10 can be enhanced, even after a reflow process is carried out at a temperature of about 300° C.

In addition, when a material having a thermal conductivity higher than a thermal conductivity of the resin part 30 is used to form the supporting member 50, heat transfer is improved.

Moreover, when either one of the insulating layers 44, 45 of the wiring structure is made of a thermosetting resin including a stiffener, stiffness of the electric part package can be enhanced, and reduction in warpage of the electric part package 10, which is realized by the remaining supporting member 50, is assured.

A First Modification of the First Embodiment

While the supporting member 50 having the openings 50*x* is exposed in the electric part package 10 according to the first embodiment, the supporting member 50 may be covered with an insulating layer. A first modification of the first embodiment where the supporting member 50 and the openings 50*x* are covered with an insulating film is explained in the following. In this example, explanation is focused on differences between this example and the first embodiment, and repetitive explanation is omitted.

Figure 18:
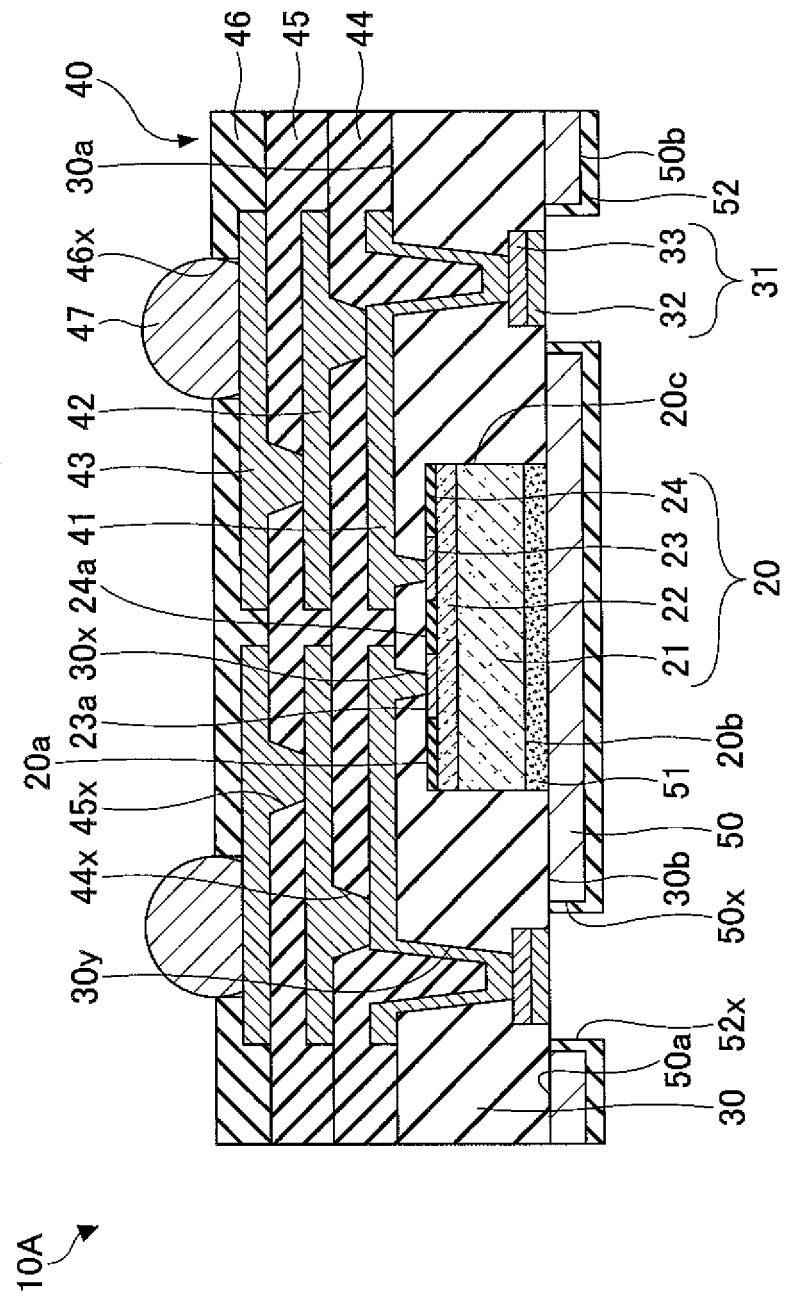
FIG. 18 illustrates a configuration of an electric part package according to a first modification of the first embodiment.

A Structure of an Electric Part Package According to a First Modification of the First Embodiment FIG. 18 is a cross-sectional view of an electric part package according to the first modification of the first embodiment. As illustrated, an electric part package 10A is different from the electric part package 10 illustrated in FIG. 6 in that the supporting member is covered with an insulating layer 52. In the following, repetitive explanation about the same members or parts of the electric part package 10A as those of the electric part package 10 is omitted, and differences between the electric part package 10A and the electric part package 10 are mainly explained.

In addition, a solder resist layer 52 is explained as an example of the insulating layer 52 in the following.

The supporting member 50 of the electric part package 10A has the same structure as the supporting member 50 of the electric part package 10, except that the surface 50*b* of the electric part package 10A is covered with the solder resist layer 52.

The solder resist layer 52 is formed in order to cover the surface 50*b* of the supporting member 50. Openings 52*x* are formed in the solder resist layer 52 so that the electrode terminals 31 are exposed in the corresponding openings 52*x*. Namely, the openings 52*x* are formed in positions that overlap the corresponding openings 50*x* of the supporting member 50. In addition, the openings 52*x* are formed to be open within the corresponding openings 50*x* of the supporting member 50. When the supporting member 50 is formed of an electrically conductive material such as metal, the solder resist layer 52 functions as an insulating layer that insulates the electrode terminals 31 from the supporting member 50.

A Manufacturing Method of the Electric Part Package According to the First Modification of the First Embodiment A manufacturing method of the electric part package according to the first modification of the first embodiment of the present invention is similar to the manufacturing method of the electric part package according to the first embodiment explained with reference to FIGS. 8 through 17, and thus repetitive explanation about the same process steps is omitted.

Figure 19:
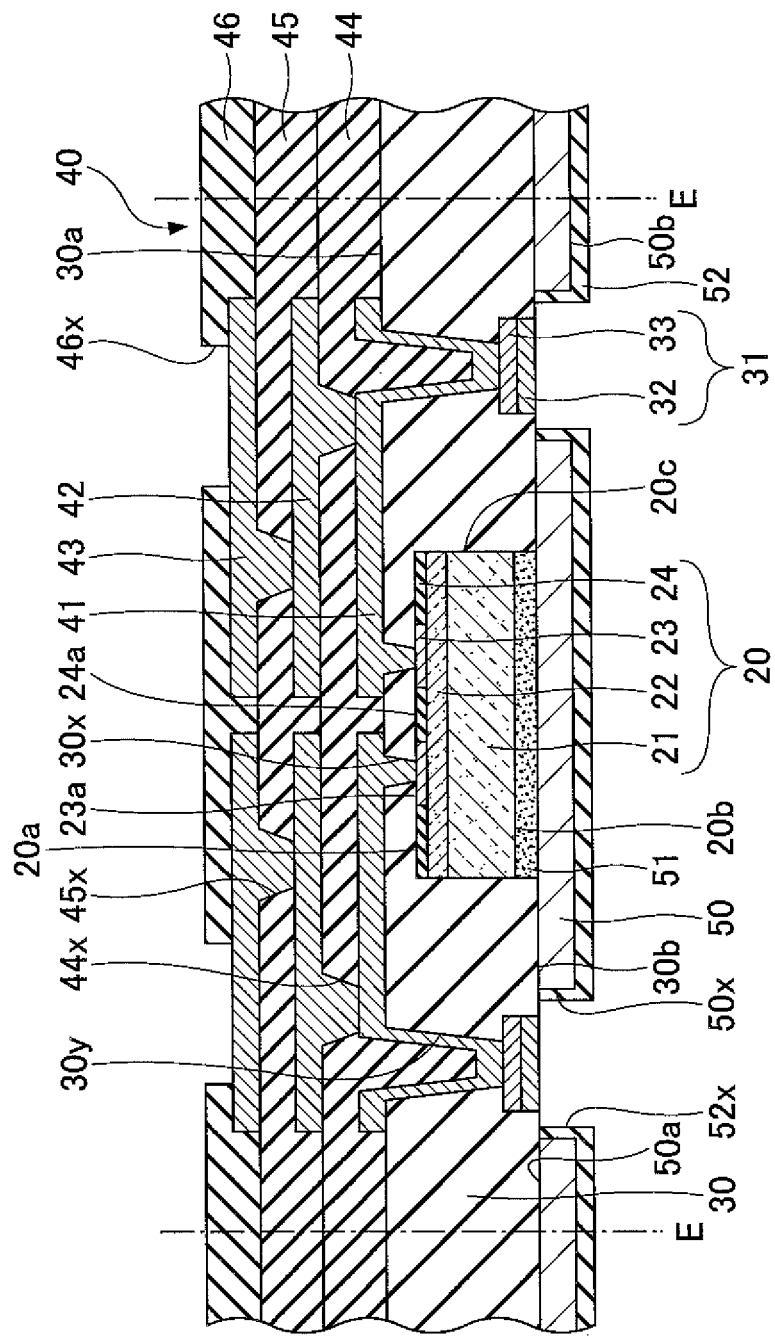
FIG. 19 is an explanatory view for explaining a manufacturing method of an electric part package, according to the first modification of the first embodiment of the present invention (Part 1)
Figure 20:
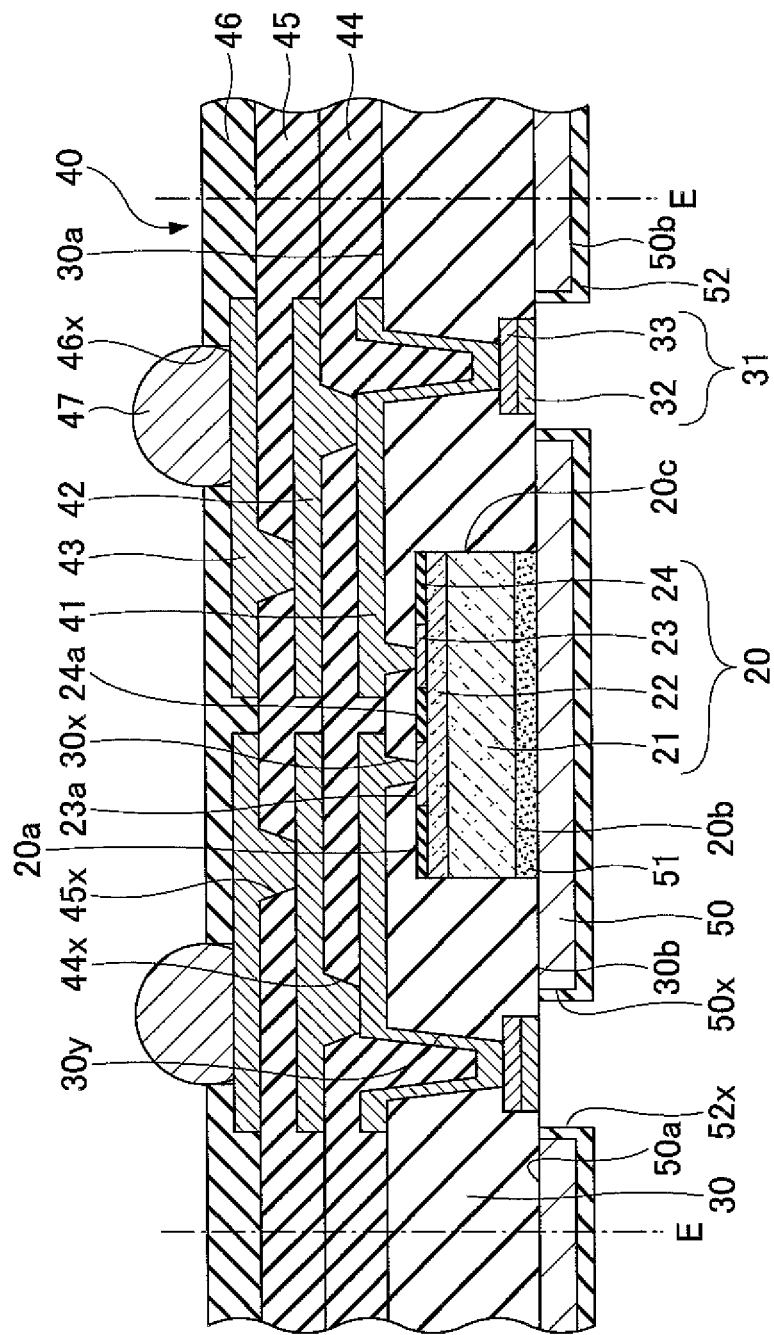
FIG. 20 is an explanatory view for explaining a manufacturing method of an electric part package, according to the first modification of the first embodiment of the present invention (Part 2)

In the first modification of the first embodiment, process steps illustrated in FIGS. 19 and 20 are carried out instead of the process step illustrated in FIG. 17, after the process step illustrated in FIG. 16.

FIGS. 19 and 20 are explanatory views for explaining the process steps that are exclusively carried out in the first modification of the first embodiment. In FIGS. 19 and 20, the same or corresponding reference symbols as those in FIG. 18 are given to the same members or parts of the first modification, and repetitive explanation may be omitted. In addition, lines E in FIGS. 19 and 20 indicate positions where a structure illustrated in FIG. 20 is severed after the process step illustrated in FIG. 20.

A solder resist is applied on the surface 50*b* of the supporting member 50 thereby forming the solder resist layer 52, and thus the solder resist layer 52 is exposed to exposure light and developed, thereby forming openings 52x in the solder resist layer 52 in a process step illustrated in FIG. 19. In this case, the openings 52x are formed to be opened within the corresponding openings 50x of the supporting member 50. With this, the electrode terminals 31 formed in the surface 30b of the resin part 30 are exposed in the corresponding openings 52x, which makes it possible to avoid electrical short circuit between the electrode terminals 31 and the supporting member 50.

Next, the solder balls 47 are mounted on the third wiring layer 43 exposed in the openings 46x of the solder resist layer 46, in a process step illustrated in FIG. 20.

Then, the structure illustrated in FIG. 20 is severed for example, along the lines E. With this, the electric part packages 10A, one of which is illustrated in FIG. 18, are finished.

A Second Modification of the First Embodiment

While a peripheral side surface 50c of the supporting member 50 having the openings 50x is exposed in the electric part package 10A according to the first modification of the first embodiment, the peripheral side surface 50c of the supporting member 50 may be covered with the insulating layer 52. A second modification of the first embodiment where the peripheral side surface 50c of the supporting member 50 is covered with the insulating film 52 is explained in the following. In this example, explanation is focused on differences between this example and the first modification of the first embodiment or the first embodiment, and repetitive explanation is omitted.

Figure 21:
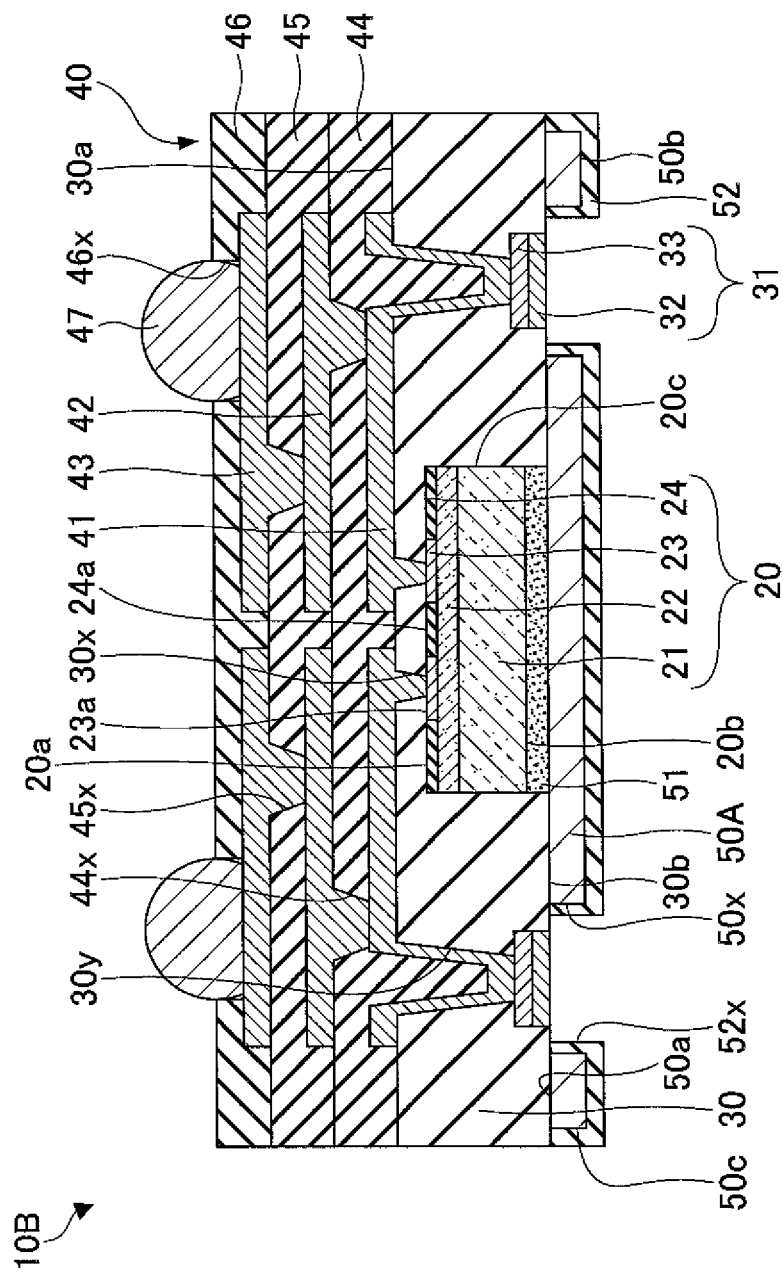
FIG. 21 illustrates a configuration of an electric part package according to a second modification of the first embodiment of the present invention.

A Structure of an Electric Part Package According to a Second Modification of the First Embodiment FIG. 21 is a cross-sectional view of an electric part package according to the second modification of the first embodiment. As illustrated, an electric part package 10B is different from the electric part package 10A illustrated in FIG. 18 in that the peripheral side surface 50c of a supporting member 50A is covered with the insulating layer 52. In the following, repetitive explanation about the same members or parts of the electric part package 103 as those of the electric part package 10A is omitted, and differences between the electric part package 10B and the electric part package 10A are mainly explained.

In addition, a solder resist layer 52 is explained in the following as an example of the insulating layer 52 in the same manner as the first modification of the first embodiment.

The supporting member 50A of the electric part package 10B has the same structure as the supporting member 50 of the electric part package 10A, except that the peripheral side surface 50c of the electric part package 108 is covered with the solder resist layer 52.

A Manufacturing Method of the Electric Part Package According to the Second Modification of the First Embodiment A manufacturing method of the electric part package according to the second modification of the first embodiment of the present invention is similar to the manufacturing method of the electric part package according to the first embodiment explained with reference to FIGS. 8 through 17, except for FIGS. 16 and 17, and thus repetitive explanation about the same process steps is omitted.

Figure 22:
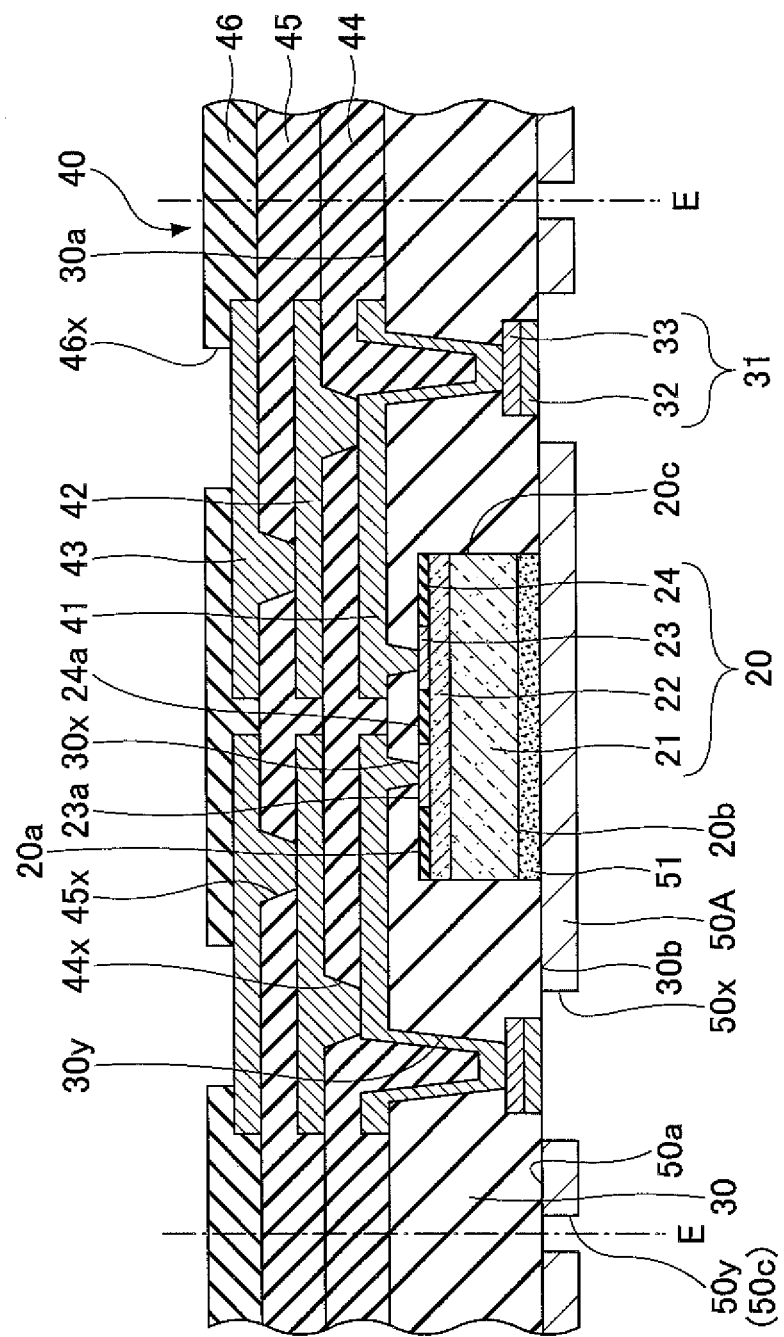
FIG. 22 is an explanatory view for explaining a manufacturing method of an electric part package, according to the second modification of the first embodiment of the present invention (Part 1)
Figure 23:
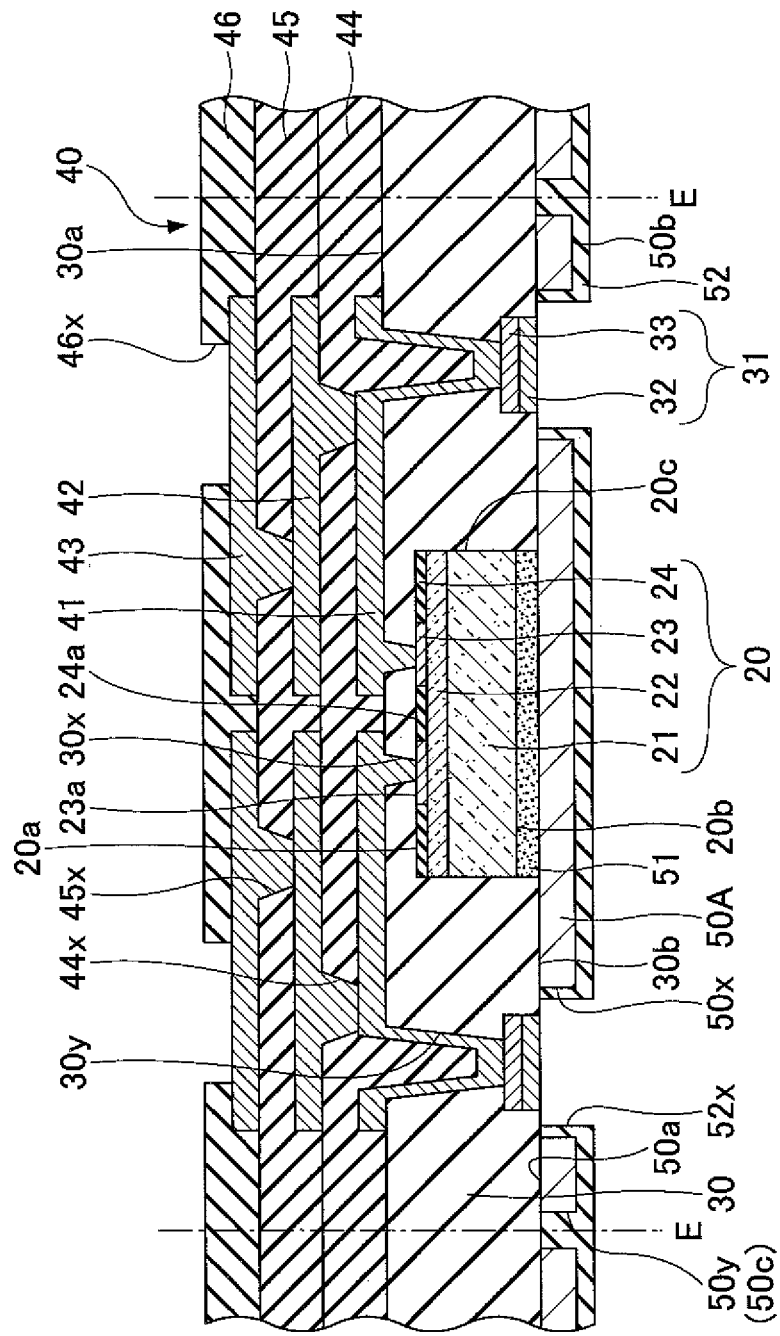
FIG. 23 is an explanatory view for explaining a manufacturing method of an electric part package, according to the second modification of the first embodiment of the present invention (Part 2)
Figure 24:
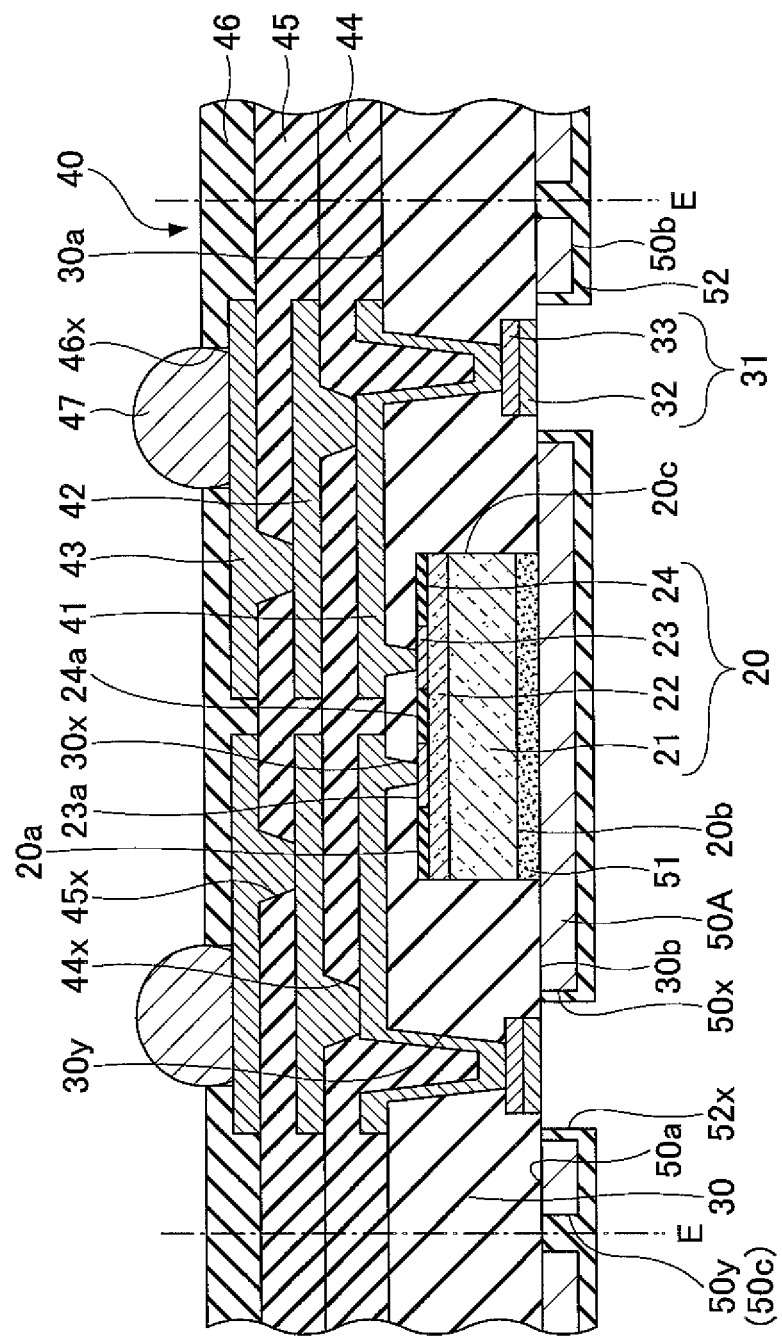
FIG. 24 is an explanatory view for explaining a manufacturing method of an electric part package, according to the second modification of the first embodiment of the present invention (Part 3)

In the second modification of the first embodiment, process steps illustrated in FIGS. 22 through 24 are carried out instead of the process steps illustrated in FIGS. 16 and 17, after the process step illustrated in FIG. 15.

FIGS. 22 through 24 are explanatory views for explaining the process steps that are exclusively carried out in the second modification of the first embodiment. In FIGS. 22 through 24, the same or corresponding reference symbols as those in FIG. 21 are given to the same members or parts of the second modification, and repetitive explanation may be omitted. In addition, lines E in FIGS. 22 through 24 indicate positions where a structure illustrated in FIG. 24 is severed after the process step illustrated in FIG. 24.

The openings 50x are formed in the supporting member 50A by removing parts of the supporting member 50A so that the electrode terminals 31 are exposed in the corresponding openings 50x, or seen from the side of the supporting member 50, and the openings 50y are formed in positions near the lines E along which the structure is to be severed, in a process step illustrated in FIG. 22. Specific methods of forming the openings 50x, 50y are the same as those in the first embodiment, which were explained with reference to FIG. 16.

Next, a solder resist is applied to cover the supporting member 50A thereby forming the solder resist layer 52, which is in turn exposed to exposure light and developed, thereby forming the openings 52x, in a process step illustrated in FIG. 23. In this case, the openings 52x are formed to be open within the corresponding openings 50x of the supporting member 50A. With this, the electrode terminals 31 formed in the surface 30b of the resin part 30 are exposed in the corresponding openings 52x of the solder resist layer 52. In addition, the openings 50y formed near the lines E are filled with the solder resist, which can avoid electrical short circuit between the electrode terminals 31 and the supporting member 50A and between the peripheral side surface 50c of the supporting member 50A and other packages.

Next, the solder balls 47 are mounted on the third wiring layer 43 exposed in the openings 46x of the solder resist layer 46, in a process step illustrated in FIG. 24.

Then, the structure illustrated in FIG. 24 is severed, for example, along the lines E. With this, the electric part packages 10B, one of which is illustrated in FIG. 21, are finished.

Second Embodiment

While the supporting member 50 is not electrically connected to any wiring layer in the electric part package in the first embodiment, the supporting member 50 may be electrically connected to a ground line. In a second embodiment, an electric part package whose supporting member is formed of an electrically conductive material and electrically connected to the ground line is explained. In the second embodiment, explanation about members or parts corresponding to those in the first embodiment is omitted, and differences between the second and the first embodiments are mainly explained.

A Structure of an Electric Part Package According to a Second Embodiment

Figure 25:
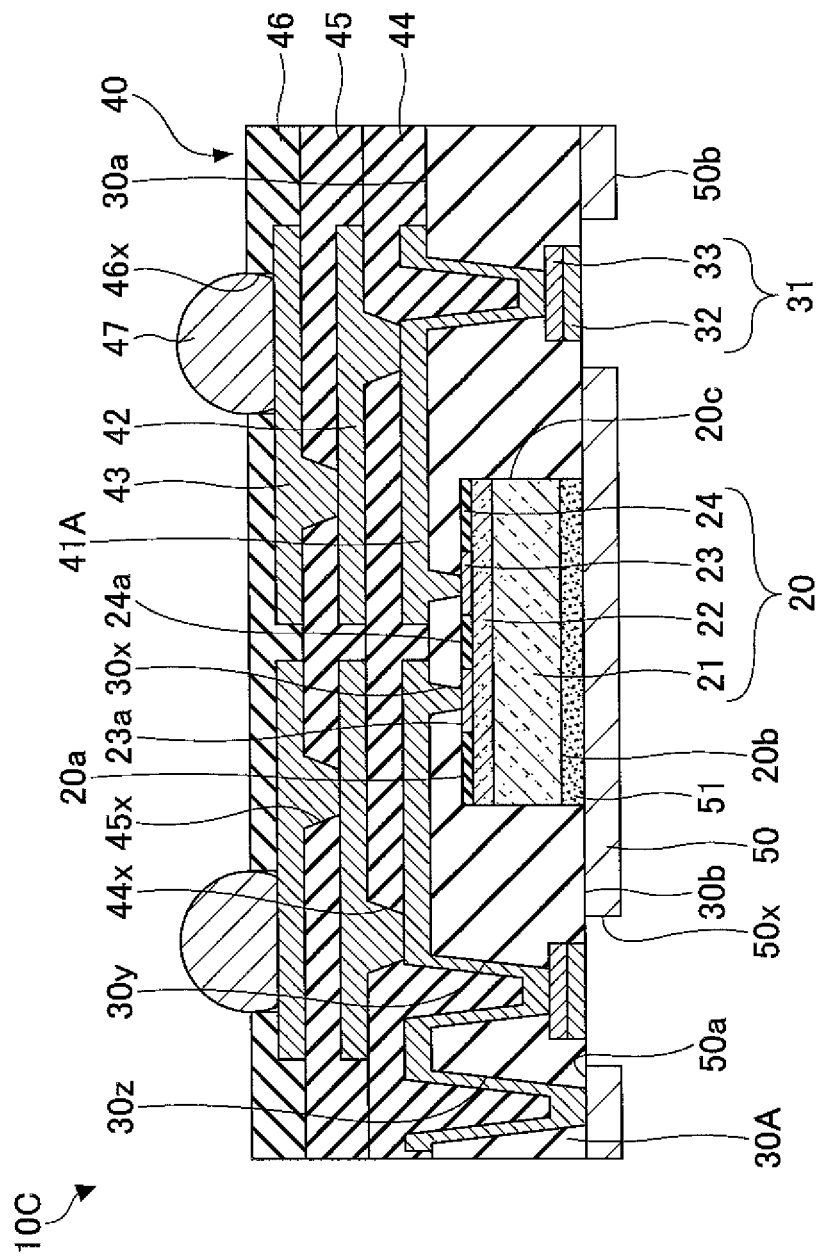
FIG. 25 illustrates a configuration of an electric part package according to a second embodiment of the present invention.

FIG. 25 is a cross-sectional view illustrating an electric part package according to the second embodiment of the present invention. As illustrated, an electric part package 10C is different from the electric part package 10 illustrated in FIG. 6 in that the supporting member 50 formed of an electrically conductive material is electrically connected to a first wiring layer 41A by way of via holes 30z that go through a resin part 30A. In the following, explanation about members or parts corresponding to those in the electric part package 10 is omitted, and differences between the electric part package 10C and the electric part package 10 are mainly explained.

The resin part 30A has the same structure as the resin part 30 of the electric package 10, except that the via holes 30z are formed. The via holes 30z go through the resin part 30.

The first wiring layer 41A has the same structure as the first wiring layer 41 of the electric part package 10, except that the first wiring layer 41A is electrically connected to the supporting member 50 by way of the via holes 30z that go through the resin part 30A.

A Manufacturing Method of the Electric Part Package According to the Second Embodiment A manufacturing method of, the electric part package according to the second embodiment of the present invention is similar to the manufacturing method of the electric part package according to the first embodiment explained with reference to FIGS. 8 through 17, except for FIGS. 12 through 17, and thus repetitive explanation about the same process steps is omitted.

In the second embodiment, process steps illustrated in FIGS. 26 through 29 are carried out instead of the process step illustrated in FIG. 12, after the process step illustrated in FIG. 11.

Figure 27:
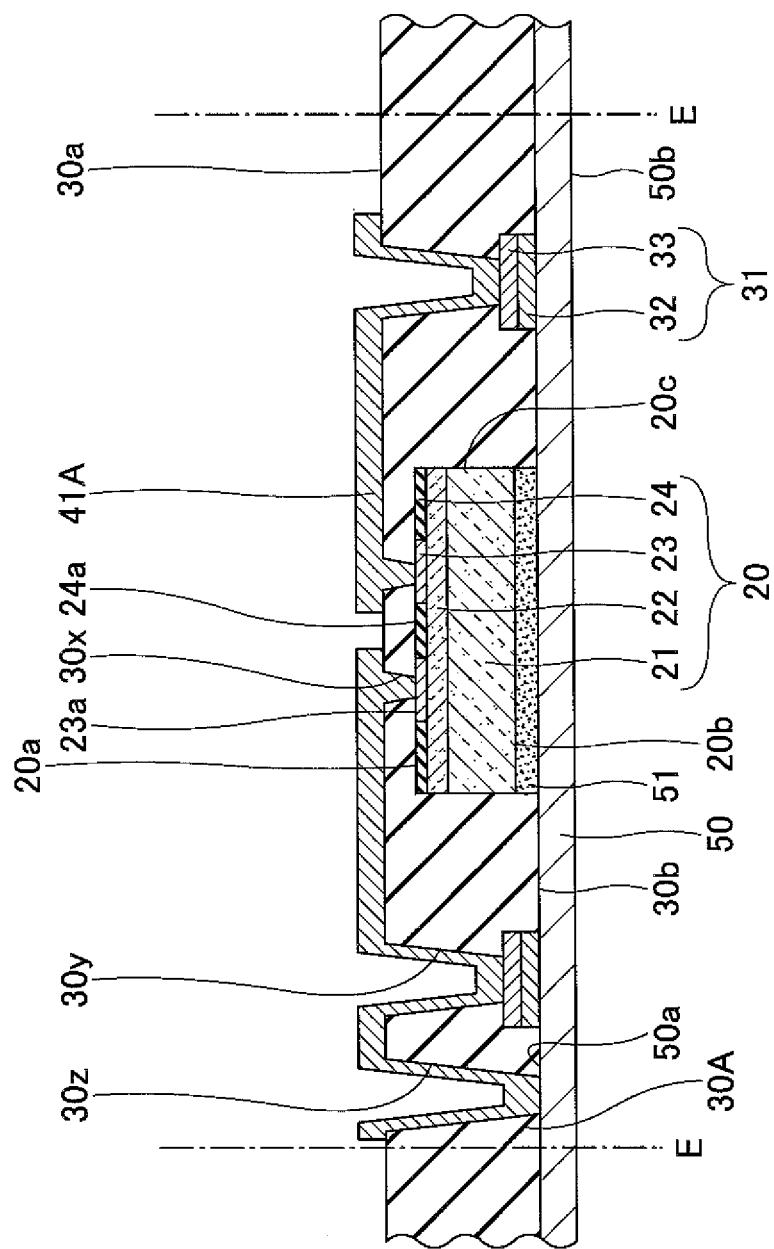
FIG. 27 is an explanatory view for explaining a manufacturing method of an electric part package, according to the second embodiment of the present invention (Part 2)
Figure 28:
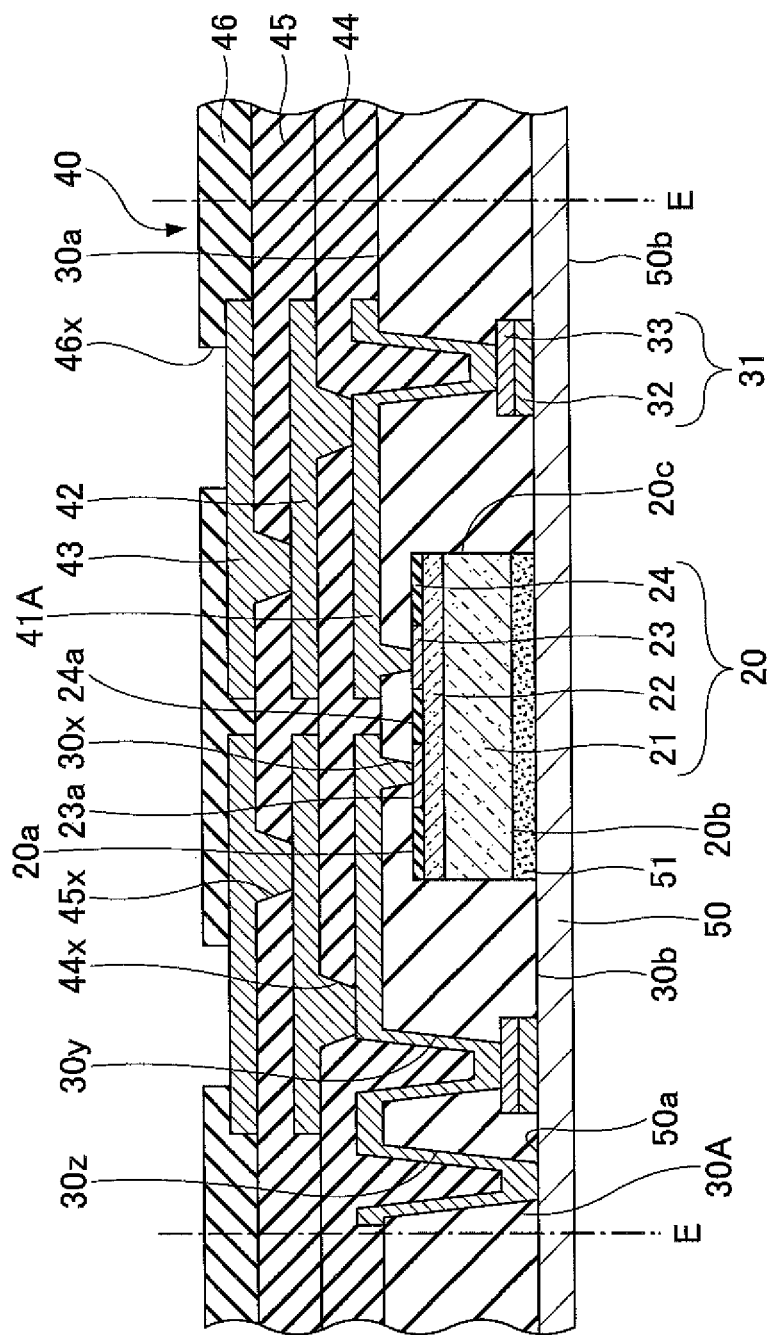
FIG. 28 is an explanatory view for explaining a manufacturing method of an electric part package, according to the second embodiment of the present invention (Part 3)
Figure 29:
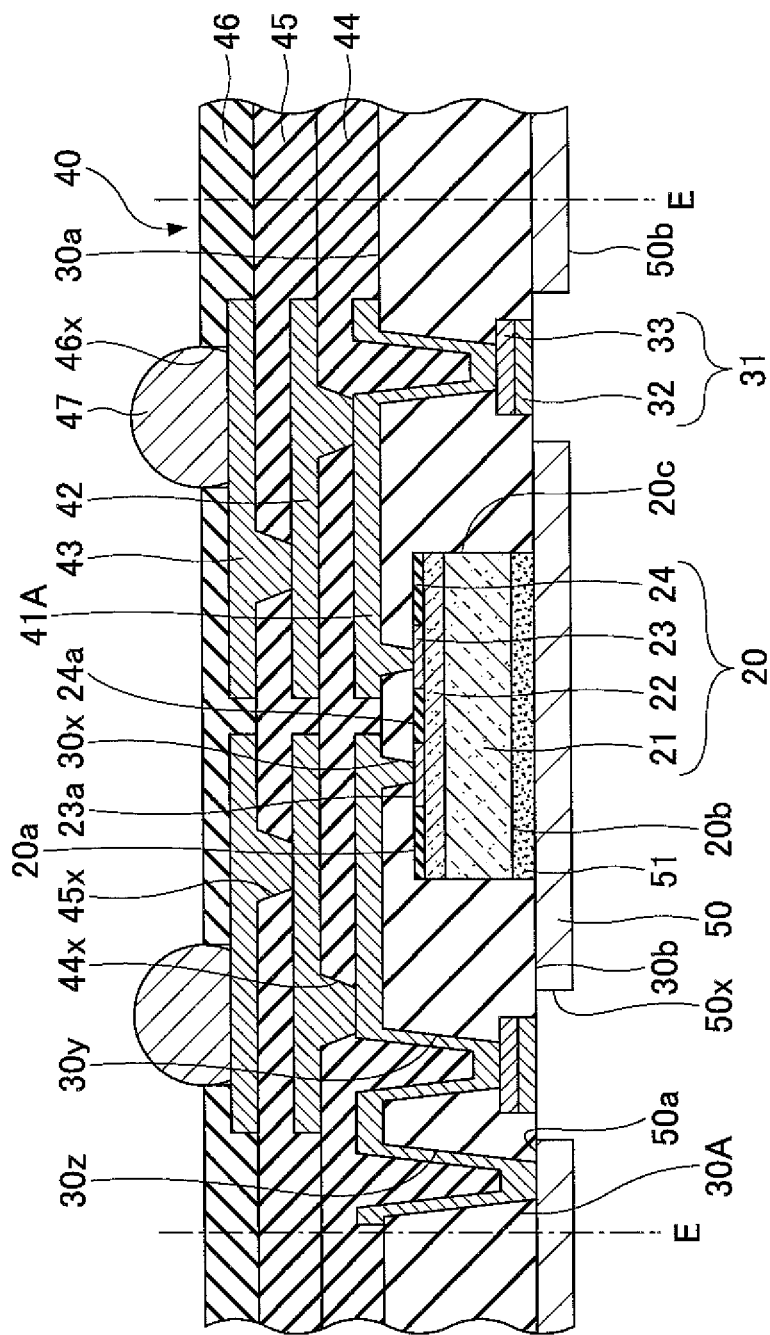
FIG. 29 is an explanatory view for explaining a manufacturing method of an electric part package, according to the second embodiment of the present invention (Part 4)

FIGS. 26 through 29 are explanatory views for explaining the process steps that are exclusively carried out in the second embodiment. In FIGS. 26 through 29, the same or corresponding reference symbols as those in FIG. 25 are given to the same members or parts in FIGS. 26 through 29, and repetitive explanation may be omitted. In addition, lines E in FIGS. 26 through 29 indicate positions where a structure illustrated in FIG. 29 is severed after the process step illustrated in FIG. 29.

Figure 26:
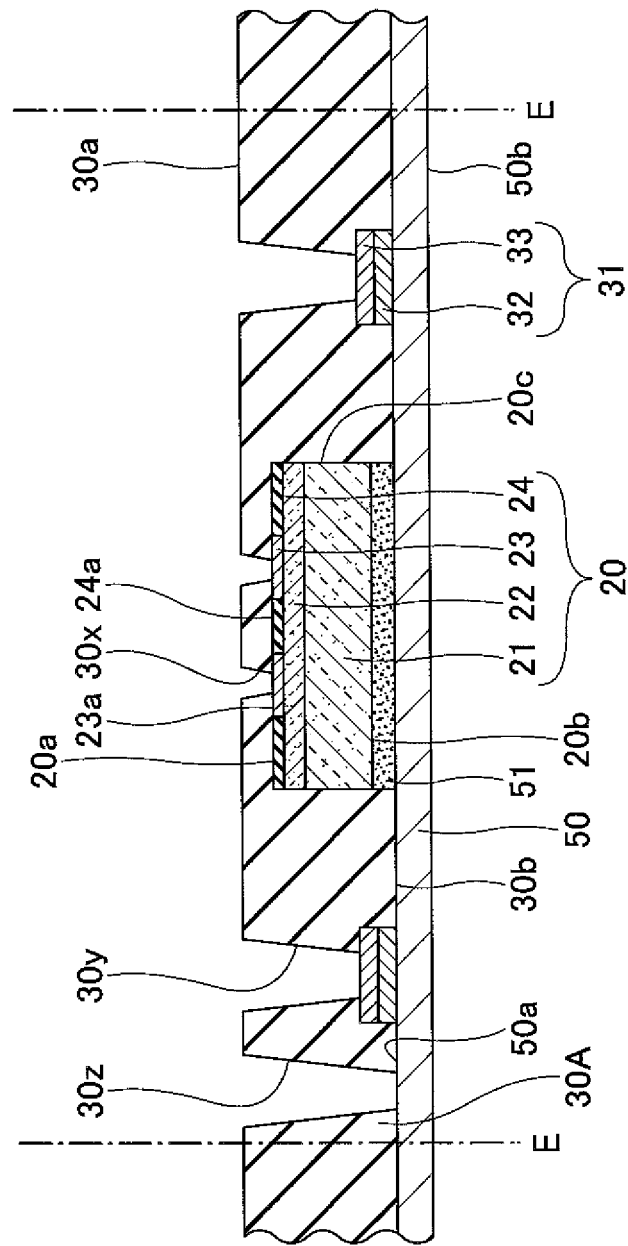
FIG. 26 is an explanatory view for explaining a manufacturing method of an electric part package, according to the second embodiment of the present invention (Part 1)

The via holes 30z in addition to the via holes 30x, 30y that go through the resin part 30 are formed in the resin part 30A by employing a laser machining method, in a process step illustrated in FIG. 26. The via holes 30z are formed in positions that do not overlap the electrode terminals 31 formed in the resin part 30A.

Next, the first wiring layer 41A is formed on the resin part 30A in a process step illustrated in FIG. 27. The first wiring layer 41A is electrically connected to the electrode pads 23 exposed in the via holes 30x, the electrode terminals 31 exposed in the via holes 30y, and the supporting member 50. A specific method of forming the first wiring layer 41A is the same as that in the first embodiment, which was explained with reference to FIG. 13.

The first wiring layer 41A can serve as a ground wiring that electrically connects the supporting member 50 to ground. With this, electrical charge is accumulated in the supporting member 50 when the supporting member 50 is formed of an electrically conductive material, thereby reducing an adverse electromagnetic influence on the electric part such as the semiconductor chip 20.

Next, the built-up wiring layer is formed by stacking the first insulating layer 44, the second wiring layer 42, the second insulating layer 45, and the third wiring layer 43 by employing a method that is similar to that explained with reference to FIGS. 14 through 15, and then the solder resist layer 46 is formed, in a process step illustrated in FIG. 28.

Next, the openings 50x are formed in the supporting member 50 by removing parts of the supporting member 50 so that the electrode terminals 31 are exposed in the corresponding openings 50x, or seen from the side of the supporting member 50, in the similar manner to that illustrated in FIG. 16 in the first embodiment. Then, the solder balls 47 are mounted on the third wiring layer 43 exposed in the openings 46x of the solder resist layer 46, in the similar manner to that illustrated in FIG. 17 in the first embodiment.

Subsequently, the structure illustrated in FIG. 29 is severed along, for example, the lines E. With this, the electric part packages 10C, one of which is illustrated in FIG. 25, are finished.

A Modification of the Second Embodiment

While the supporting member 50 having the openings 50x is exposed in the second embodiment, the supporting member 50 may be covered with an insulating layer. A modification of the second embodiment where the supporting member 50, the openings 50x, and the peripheral side surface 50c are covered with an insulating film is explained in the following. In this example, explanation is focused on differences between this modification and the second embodiment, and repetitive explanation is omitted.

Figure 30:
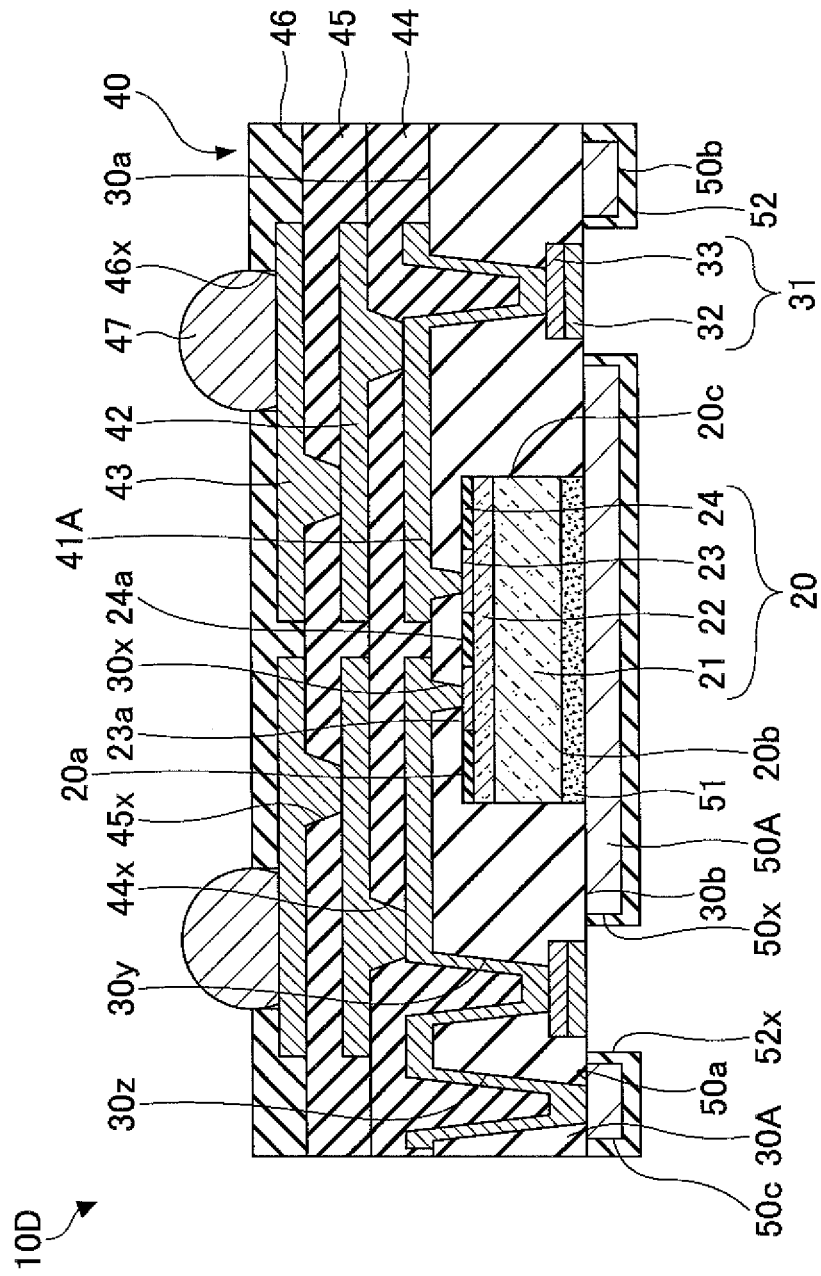
FIG. 30 illustrates a configuration of an electric part package according to a modification of the second embodiment of the present invention.

A Structure of an Electric Part Package According to a Modification of the Second Embodiment FIG. 30 is a cross-sectional view of an electric part package according to the modification of the second embodiment. As illustrated, an electric part package 10D is different from the electric part package 100 illustrated in FIG. 25 in that the supporting member 50A and the peripheral side surface 50c of the supporting member 50A are covered with the insulating layer 52. Incidentally, the electric part package 10D is the same as the electric part package 10B illustrated in FIG. 21 in that the peripheral side surface 50c of the supporting member 50A is covered with the insulating layer 52. In the following, repetitive explanation about the same members or parts of the electric part package 10D as those of the electric part package 100 or the electric part package 10B is omitted, and portions different from those of either one of the electric part package 100 and the electric part package 10B are mainly explained.

In addition, a solder resist layer 52 is explained as an example of the insulating layer 52 in the following.

The supporting member 50A has the same structure as the supporting member 50A of the electric part package 103. In addition, the solder resist layer 52 is formed to cover the supporting member 50A, the openings 50x, and the peripheral side surface 50c. Namely, the solder resist layer 52 has the same as the solder resist layer 46. When the supporting member 50A is made of, for example, an electrically conductive material, the solder resist layer 52 maintains insulation between the electrode terminal 31 and the supporting member 50A, and functions as an insulating layer for maintaining insulation of the peripheral side surface 50c of the supporting member 50A.

A Manufacturing Method of the Electric Part Package According to the Modification of the Second Embodiment A manufacturing method of the electric part package according to the modification of the second embodiment of the present invention is similar to the manufacturing method of the electric part package according to the second embodiment, except for the process step illustrated in FIG. 29, and thus repetitive explanation about the same process steps is omitted.

Specifically, after the process step illustrated in FIG. 28, the process steps illustrated in FIGS. 22 through 24, which have been explained above, according to the second modification of the first embodiment are carried out instead of the process step illustrated in FIG. 29, in the modification of the second embodiment.

Incidentally, the peripheral side surface 50c of the supporting member 50A is not necessarily covered with an insulating layer, in the same manner as the first modification of the first embodiment. In this case, the process step illustrated in FIG. 16 in the first embodiment and the process steps illustrated in FIGS. 19 and 20 in the first modification of the first embodiment are carried out instead of the process step illustrated in FIG. 29, after the process step illustrated in FIG. 28.

Third Embodiment

While the electrode pads 23 are formed on the surface 20a of the semiconductor chip 20 (the electric part 20) in the electric part package 10 according to the first embodiment, electrodes may be formed on the surface 20b of the semiconductor chip 20 thereby to be exposed on the opposing side of the wiring structure 40. In a third embodiment, an electric part package where through electrodes 25 are formed in a semiconductor chip 20A (an electric part 20A) thereby to be exposed on the opposing side of the wiring structure 40 is explained. In the third embodiment, explanation about members or parts corresponding to those in the first embodiment is omitted, and differences between the second and the first embodiments are mainly explained.

A Structure of an Electric Part Package According to the Third Embodiment

Figure 31:
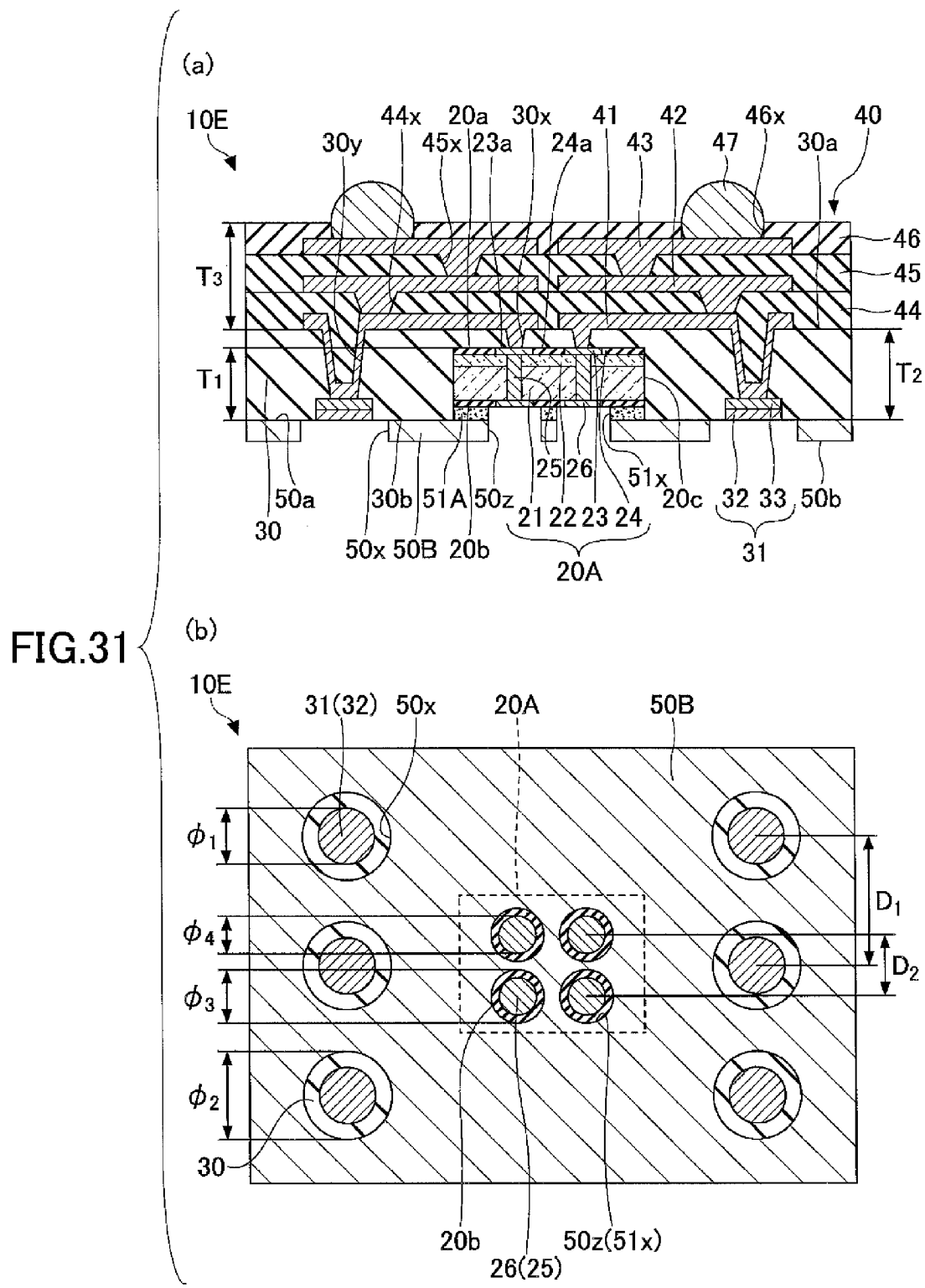
FIG. 31 illustrates a configuration of an electric part package according to a third embodiment of the present invention (Part 1)

FIG. 31 is an explanatory view illustrating an electric part package according to the third embodiment of the present invention. Sections (a) and (b) of FIG. 31 are a cross-sectional view and a bottom view of the electric part package according to the third embodiment, respectively. As illustrated, an electric part package 10E is different from the electric part package 10 illustrated in FIG. 6 in that the through electrodes 25 are formed in the semiconductor chip 20A and openings 50z are formed in a supporting member 503 so that one end of each of the through electrodes 25 is exposed in the corresponding openings 50z. In the following, explanation about members or parts corresponding to those in the electric part package 10 is omitted, and differences between the electric part package 10E and the electric part package 10 are mainly explained.

The semiconductor chip 20A has the same structure as the semiconductor chip 20 of the electric part package 10 except that the through electrodes 25 that go through the semiconductor chip 20A in the semiconductor chip 20A. The through electrodes 25 go through from the surface 20b (or 20a) to the surface 20a (or 20b). For example, first ends of the through electrodes 25 are electrically connected to corresponding electrode pads 26, and the other ends of the through electrodes 25 are electrically connected to the electrode pads 23 that are provided to form substantially one plane along with the surface 20a.

The supporting member 502 has the same structure as the supporting member 50 of the electric part package 10 except that the openings 50z are formed in the supporting member 50B so that the electrode pads 26 (the through electrodes 25) are exposed in the corresponding openings 50z. The openings 50z are formed in positions of the supporting member 50B, the positions overlapping the corresponding electrode pads 26.

In addition, because the semiconductor chip 20A is arranged on the supporting member 50B by way of the adhesive layer 51A, openings 51x are formed in the adhesive layer 51A thereby to allow the through electrodes 25 to be exposed therein. Namely, openings 51x are formed in positions of the adhesive layer 51A, the positions overlapping the corresponding electrode pads 26.

Each of the openings 50z, 50x may have a plan view shape of a circle. When a diameter φ4 of the electrode pad 26 is, for example, about 200 μm and pitch D2 between the two adjacent electrode pads 26 is, for example, about 400 μm, an inner diameter φ3 of the openings 50z may be, for example, about 300 μm.

Figure 32:
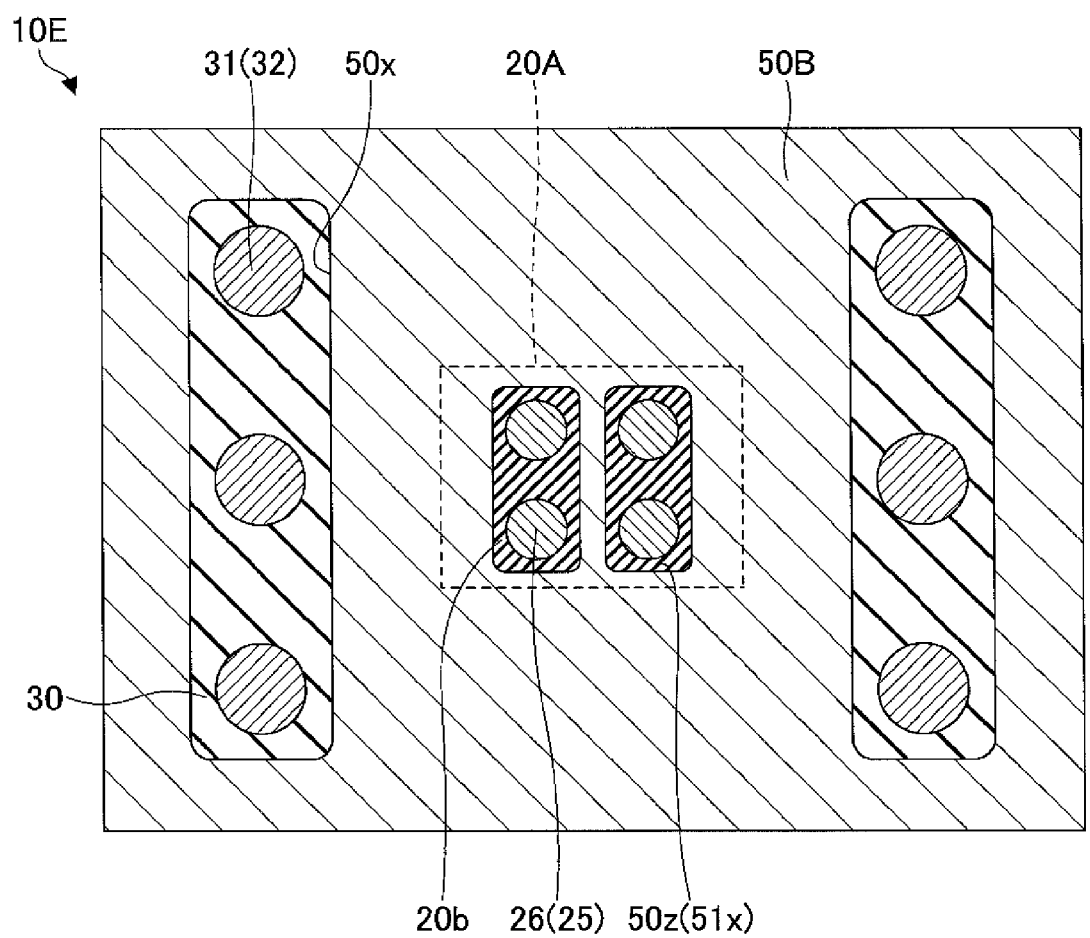
FIG. 32 illustrates a configuration of an electric part package according to the third embodiment of the present invention (Part 2)

Incidentally, each pair of the opening 50z and the opening 51 may include a corresponding one of the electrode pads 26, as illustrated in FIG. 31. Alternatively, one pair of the opening 50z and the opening 50x may include two or more electrode pads 26, as illustrated in FIG. 32.

A Manufacturing Method of the Electric Part Package According to the Third Embodiment Next, a manufacturing method of the electric part package according to the third embodiment of the present invention is explained. FIGS. 33 through 37 are explanatory views illustrating process steps of the manufacturing method of the electric part package according to the third embodiment. In FIGS. 33 through 37, the same reference symbols are given to members or parts corresponding to those in FIG. 31, and repetitive explanation is omitted. Incidentally, lines E in FIGS. 33 through 37 indicate positions where a structure illustrated in FIG. 37 is to be severed in a process step illustrated in FIG. 37.

Figure 33:
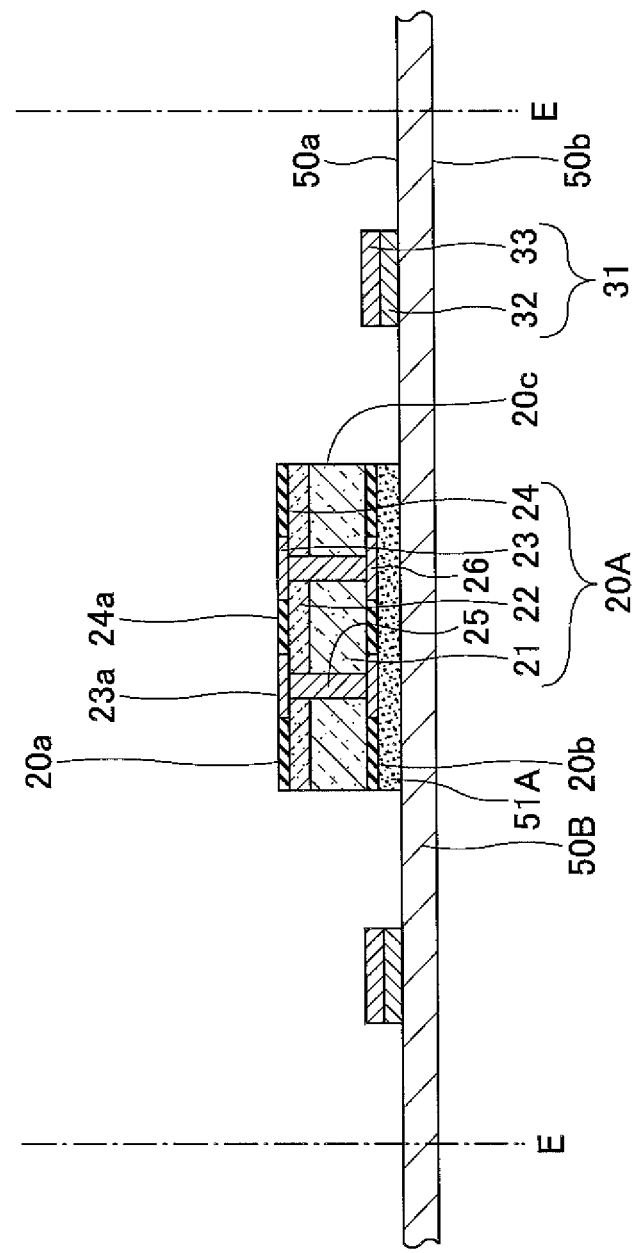
FIG. 33 is an explanatory view for explaining a manufacturing method of an electric part package, according to the third embodiment of the present invention (Part 1)

First, the semiconductor wafer 21 (the semiconductor substrate 21) having two or more semiconductor chips 20A is prepared before a process step illustrated in FIG. 33. The semiconductor wafer 21 may be prepared according to a process step similar to the process step illustrated in FIG. 8 of the first embodiment. However, the semiconductor chip 20A is different from the semiconductor chip 20 of the first embodiment in that the semiconductor chip 20A is provided with the through electrodes 25.

Next, the supporting member 50B is prepared and the semiconductor chip 20A is arranged on the surface 50a of the prepared supporting member 50B in a process step illustrated in FIG. 33. The supporting member 50B may have the same structure as the supporting member 50 of the first embodiment. The semiconductor chip 20 may be arranged according to a method similar to the method explained with reference to FIG. 9 in the first embodiment.

Figure 34:
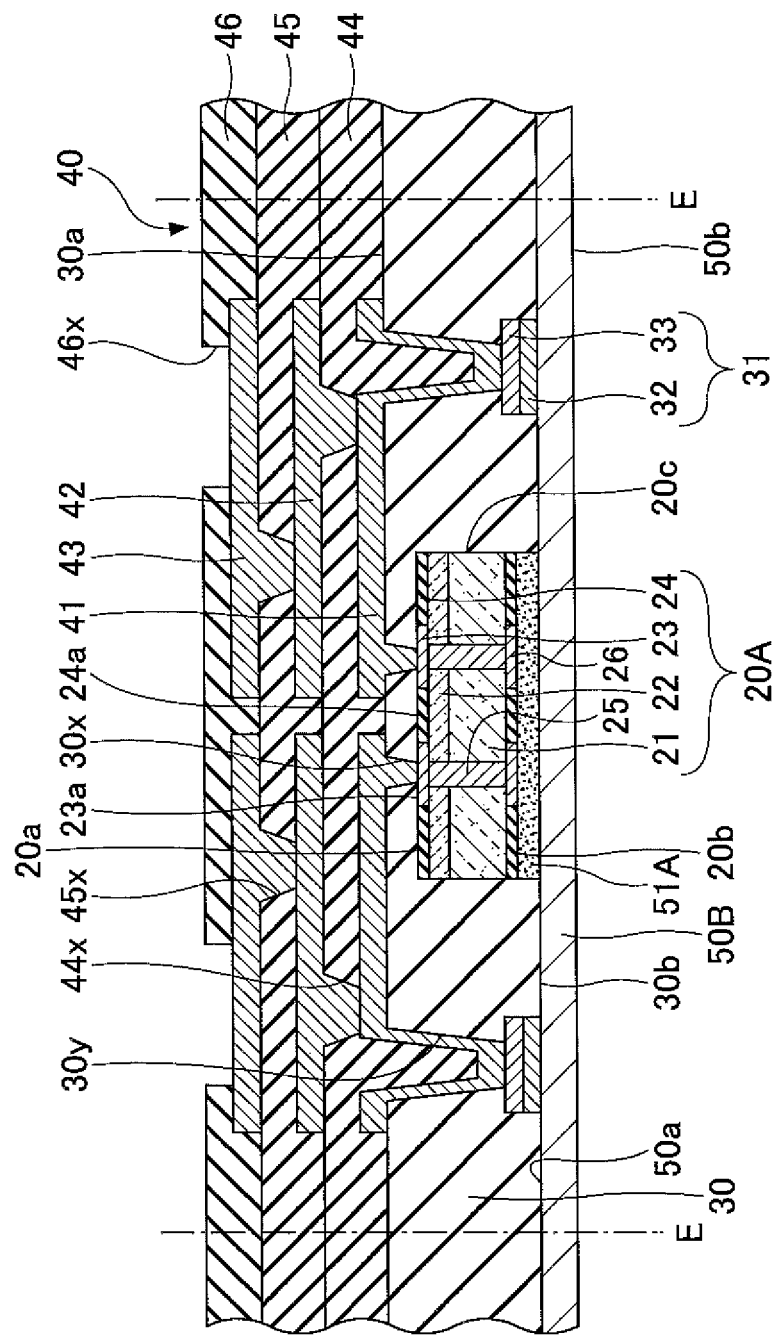
FIG. 34 is an explanatory view for explaining a manufacturing method of an electric part package, according to the third embodiment of the present invention (Part 2)

Next, the resin part 30, the wiring structure 40, and the solder resist layer 46 are formed, for example, according to a method similar to the method explained with reference to FIGS. 10 through 15, in a process step illustrated in FIG. 34.

Figure 35:
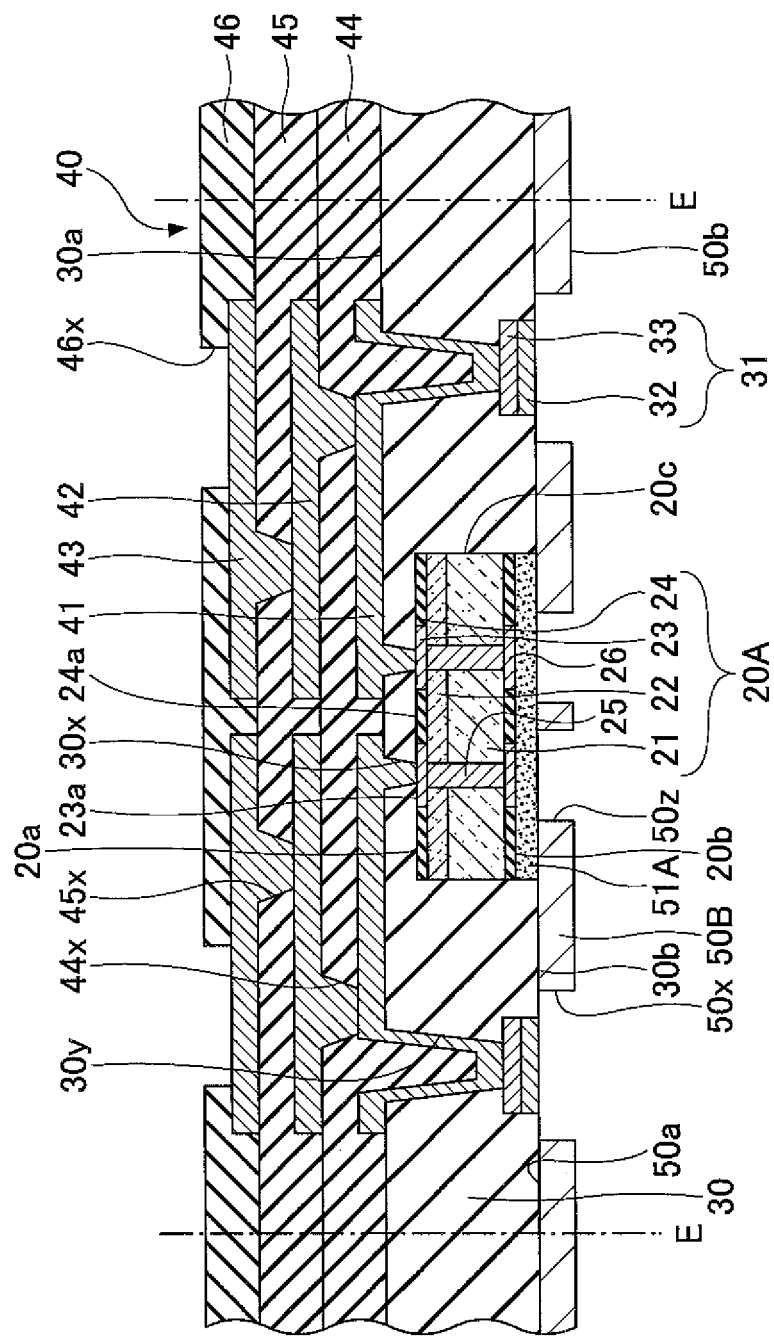
FIG. 35 is an explanatory view for explaining a manufacturing method of an electric part package, according to the third embodiment of the present invention (Part 3)

Next, the openings 50x, 50z are formed by removing parts of the supporting member 503 so that the electrode terminals 31 are exposed in the corresponding openings 50x and at least parts of the adhesive layer 51A, which overlap the corresponding electrode pads 26, are exposed in the corresponding openings 50z, in a process step illustrated in FIG. 35. The openings 50x, 50z may be formed according to a method similar to the method explained with reference to FIG. 16.

Figure 36:
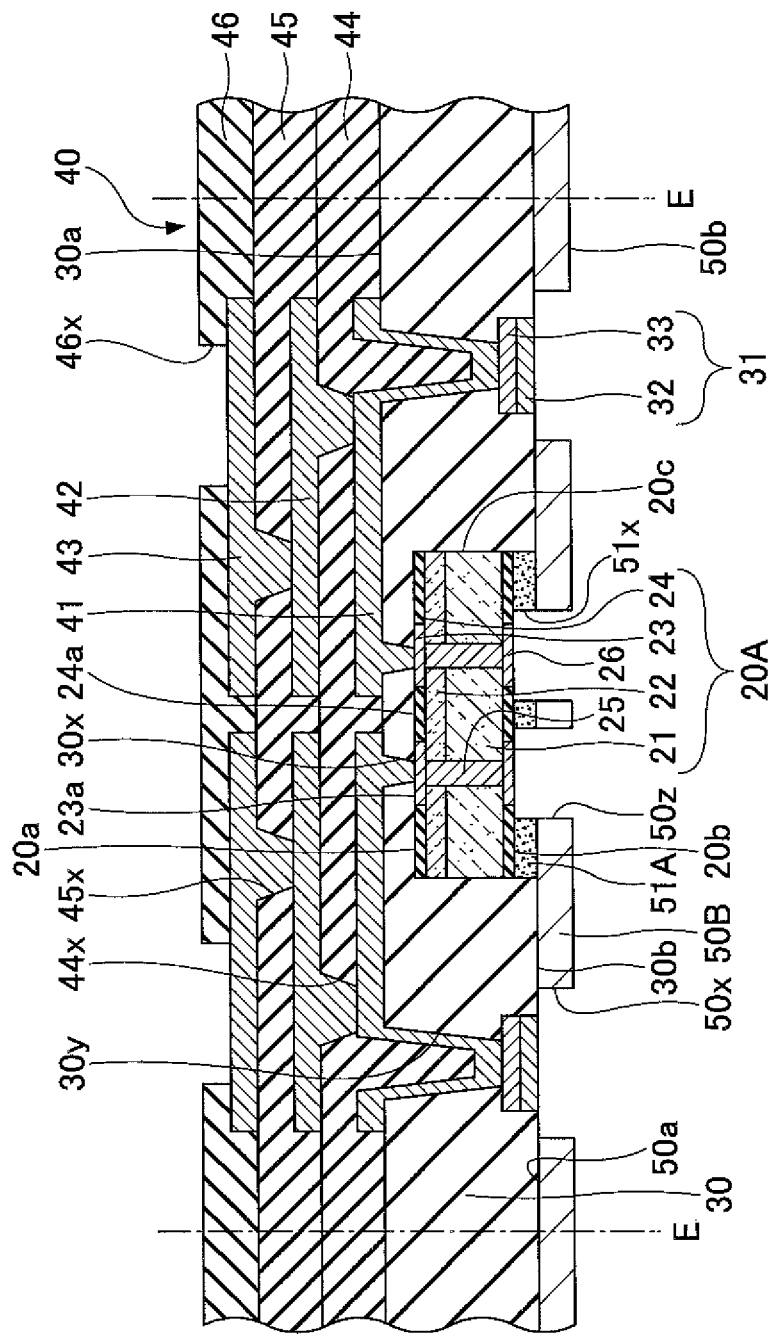
FIG. 36 is an explanatory view for explaining a manufacturing method of an electric part package, according to the third embodiment of the present invention (Part 4)
Figure 37:
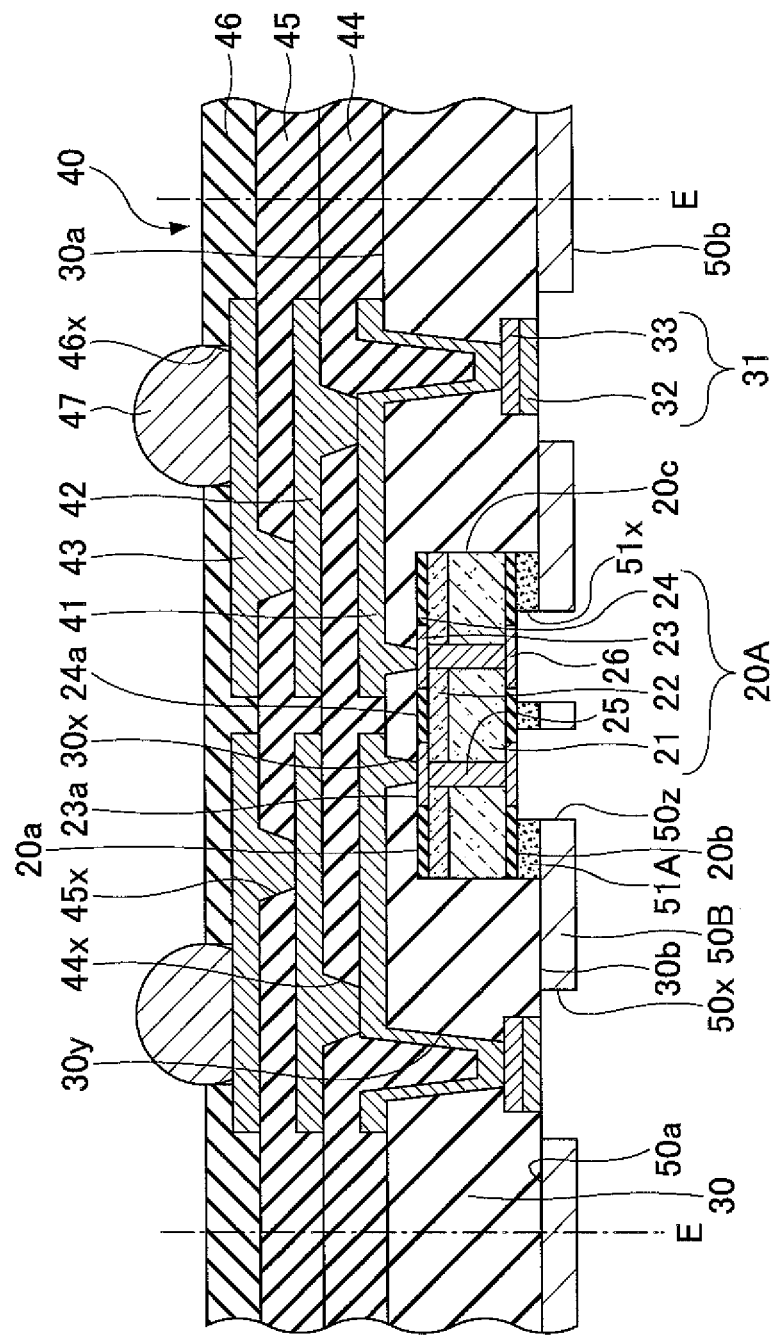
FIG. 37 is an explanatory view for explaining a manufacturing method of an electric part package, according to the third embodiment of the present invention (Part 5)

Next, the openings 51x are formed in the adhesive layer 51A by removing predetermined parts of the adhesive layer 51A so that the electrode pads 26 are exposed in the corresponding openings 51x, or seen from the side of the supporting member 50B, in a process step illustrated in FIG. 36. In other words, the openings 51x are formed in positions that overlap the corresponding openings 50x of the supporting member 50B. Incidentally, the openings 51x may be formed by dissolving the predetermined parts of the adhesive layer 51A, alternatively by a laser machining method, a blasting IC method, or a plasma process.

Next, the solder balls 47 are mounted on the third wiring layer 43 exposed in the openings 46x of the solder resist layer 46 according to a method similar to the method explained with reference to FIG. 17 of the first embodiment, in a process step illustrated in FIG. 37.

Subsequently, the structure illustrated in FIG. 37 is severed, for example, along the lines E. With this, the electric part packages ICE, one of which is illustrated in FIG. 31, are finished.

Fourth Embodiment

The supporting member 50 (or 50A, 50B) has the openings 50x in the previous embodiments and the modifications. In other words, parts of the supporting member 50 are removed to form the openings 50s. However, parts of the supporting member 50 are not necessarily removed, but the entire supporting member 50 can remain. In a fourth embodiment, an electric part package provided with a supporting member 50C without openings (or an entirely remaining supporting member 50C) is explained. In the fourth embodiment, explanation about members or parts corresponding to those in the second embodiment is omitted, and differences between the fourth and the second embodiments are mainly explained.

A Structure of an Electric Part Package According to the Fourth Embodiment

Figure 38:
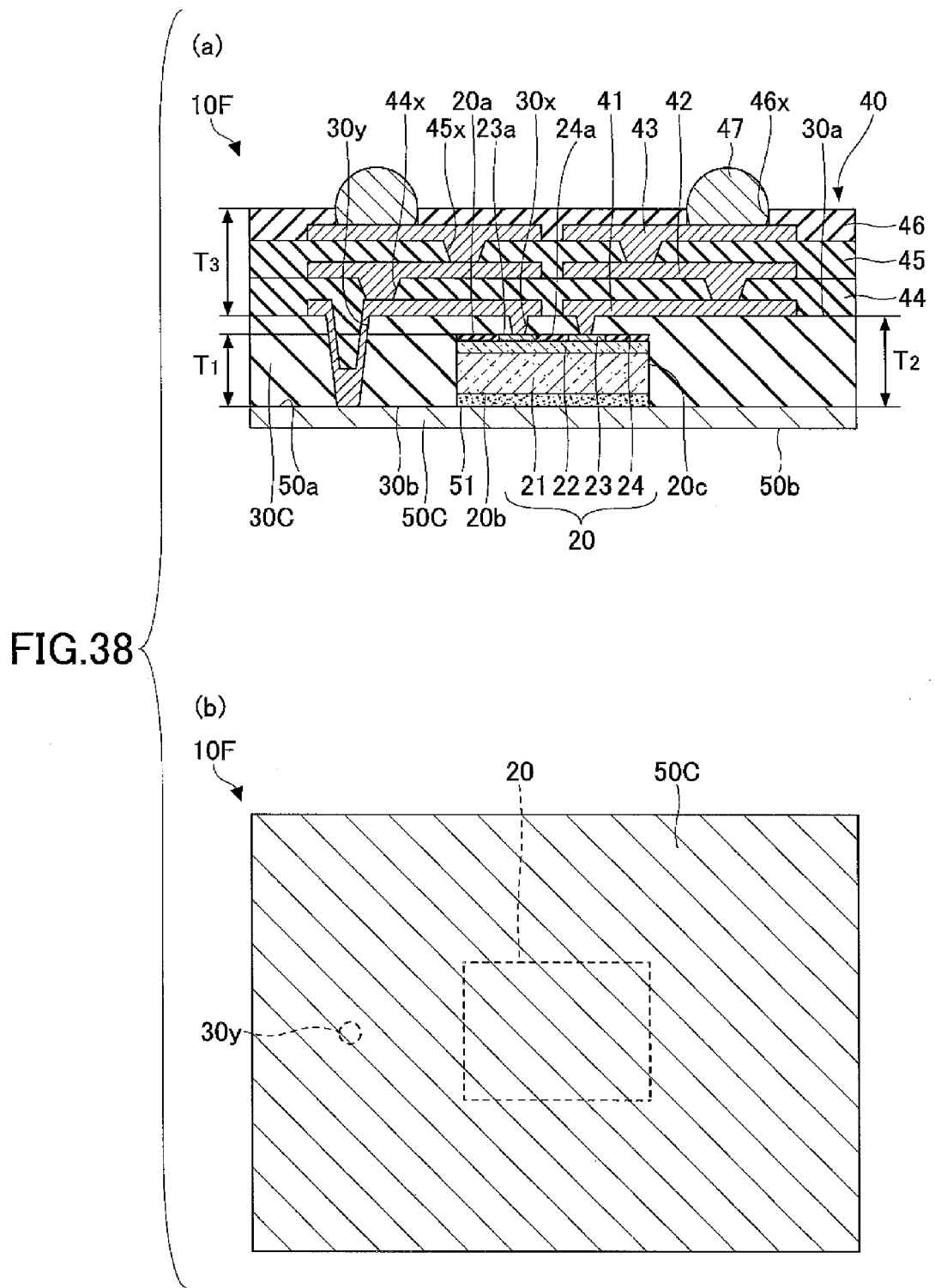
FIG. 38 illustrates a configuration of an electric part package according to a fourth embodiment of the present invention.

FIG. 38 is an explanatory view illustrating an electric part package according to the fourth embodiment of the present invention. Sections (a) and (b) of FIG. 38 are a cross-sectional view and a bottom view of the electric part package according to the fourth embodiment, respectively. As illustrated, an electric part package 10F is different from the electric part package 100 illustrated in FIG. 25 in that no electrode terminals are formed on the surface 30b of a resin part 30C and the supporting member 500 has no openings. In the following, explanation about members or parts corresponding to those in the electric part package 10 is omitted, and differences between the electric part package 10F and the electric part package 100 are mainly explained.

The resin part 30C has the same structure as the resin part 30A of the electric part package 10C except that no electrode terminals or vias electrically connecting to the electrode terminals are formed on the surface 30b of the resin part 30C.

The supporting member 50C has the same structure as the supporting member 50 of the electric part package 100 except that no parts of the supporting member 50C are removed.

Because none of the supporting member 50C is removed but it entirely remains in the electric part package 10F, warpage of the electric part package 10F, which may be caused by differences of a shrinkage amount between the resin part 30 and the semiconductor chip 20, is further reduced. In addition, because the semiconductor chip 20 and the resin part 30 are supported by the supporting member 500, stiffness of the electric part package 10F can be enhanced. Moreover, when the supporting member 50C is formed of a material having a greater thermal conductivity than that of the resin part 30, heat dissipation can be improved.

Figure 39:
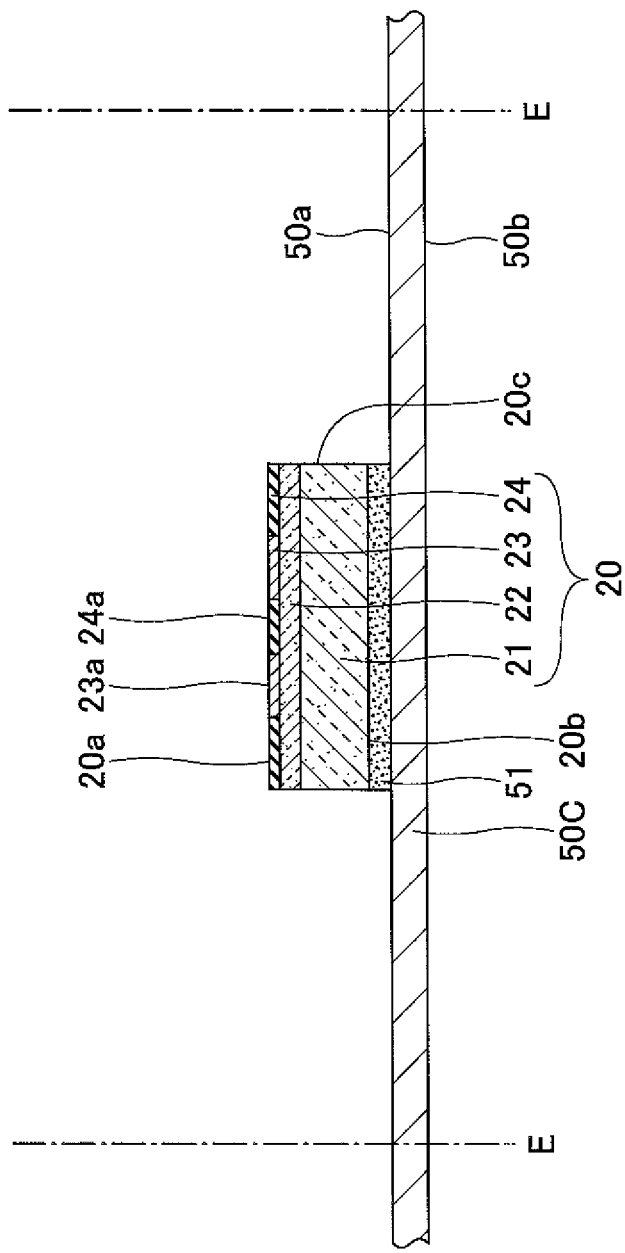
FIG. 39 is an explanatory view for explaining a manufacturing method of an electric part package, according to the fourth embodiment of the present invention (Part 1)
Figure 40:
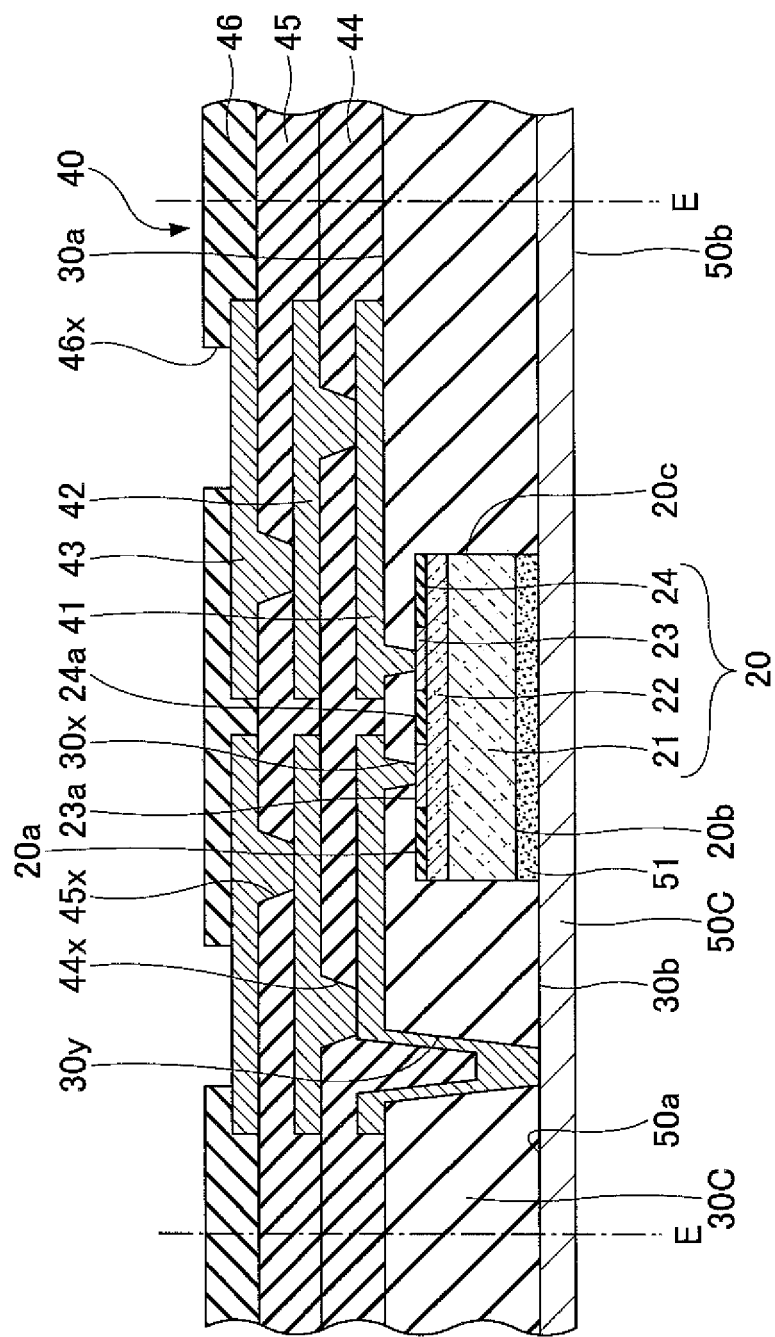
FIG. 40 is an explanatory view for explaining a manufacturing method of an electric part package, according to the fourth embodiment of the present invention (Part 2)
Figure 41:
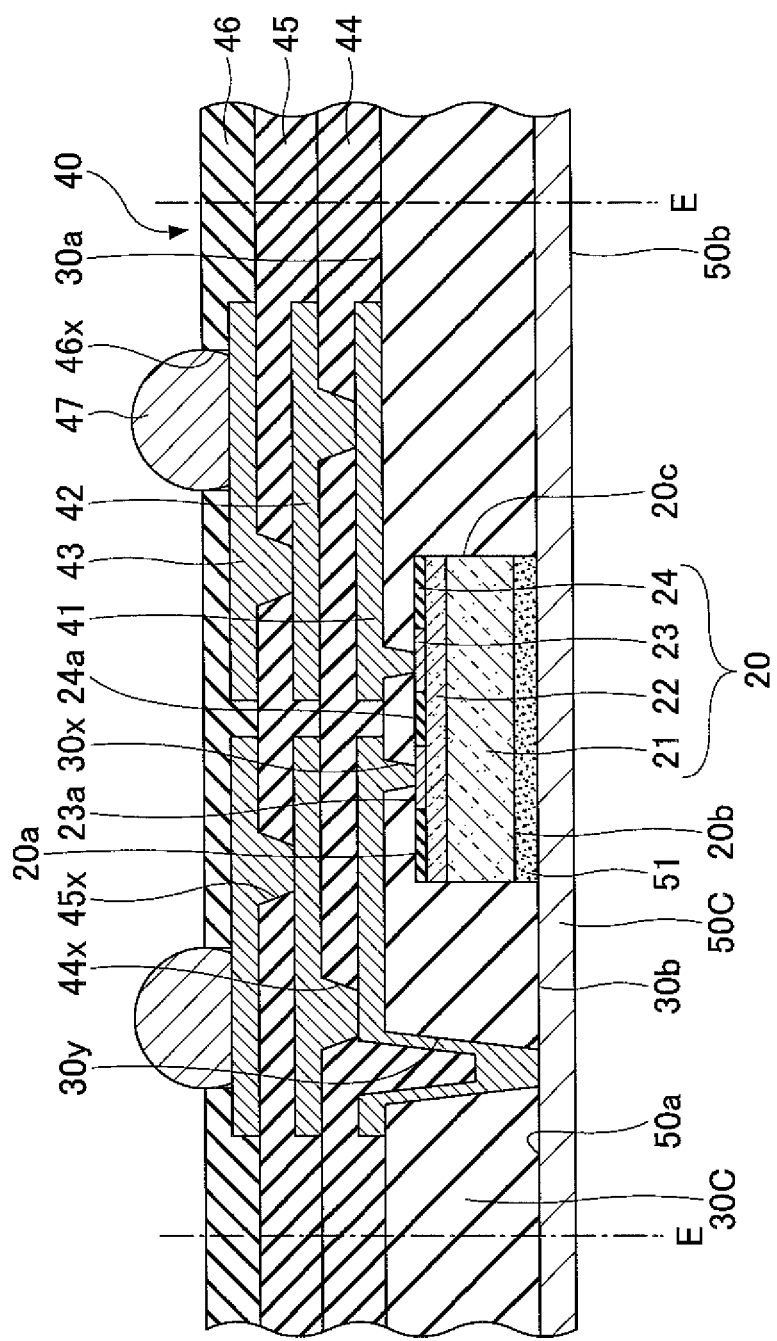
FIG. 41 is an explanatory view for explaining a manufacturing method of an electric part package, according to the fourth embodiment of the present invention (Part 3)

A Manufacturing Method of the Electric Part Package According to the Fourth Embodiment Next, a manufacturing method of the electric part package according to the fourth embodiment of the present invention is explained. FIGS. 39 through 41 are explanatory views illustrating process steps of the manufacturing method of the electric part package according to the fourth embodiment. In FIGS. 39 through 41, the same reference symbols are given to members or parts corresponding to those in FIG. 38, and repetitive explanation is omitted. Incidentally, lines E in FIGS. 39 through 41 indicate positions where a structure illustrated in FIG. 41 is severed in a process step illustrated in FIG. 41.

First, the semiconductor wafer 21 (the semiconductor substrate 21) having two or more semiconductor chips 20 is prepared before a process step illustrated in FIG. 39. The semiconductor wafer 21 may be prepared according to a process step similar to the process step illustrated in FIG. 8 of the first embodiment.

Next, the supporting member 50C is prepared and the semiconductor chip 20 is arranged on the surface 50a of the prepared supporting member 50C in a process step illustrated in FIG. 39. The supporting member 50C may have the same structure as the supporting member 50 of the first embodiment. The semiconductor chip 20 may be arranged according to a method similar to the method explained with reference to FIG. 9 in the first embodiment.

Next, the resin part 30C, the wiring structure 40, and the solder resist layer 46 are formed, for example, according to a method similar to the method explained with reference to FIGS. 10 through 15, in a process step illustrated in FIG. 40.

Next, the solder balls 47 are mounted on the third wiring layer 43 exposed in the openings 46x of the solder resist layer 46 according to a method similar to the method explained with reference to FIG. 17 of the first embodiment, in a process step illustrated in FIG. 41.

Subsequently, the structure illustrated in FIG. 41 is severed, for example, along the lines E. With this, the electric part packages 10F, one of which is illustrated in FIG. 38, are finished.

Fifth Embodiment

While the electric part package according to the first embodiment includes only one electric part, two or more electric part packages according to an embodiment of the present invention may constitute another (or composite) electric part package thereby to include two or more electric parts. In a fifth embodiment, such an (or a composite) electric part package including two or more electric part packages is explained. In this embodiment, explanation about members or parts corresponding to those in the first embodiment is omitted, and differences between the fifth and the first embodiments are mainly explained.

A Structure of an Electric Part Package According to the Fifth Embodiment

Figure 42:
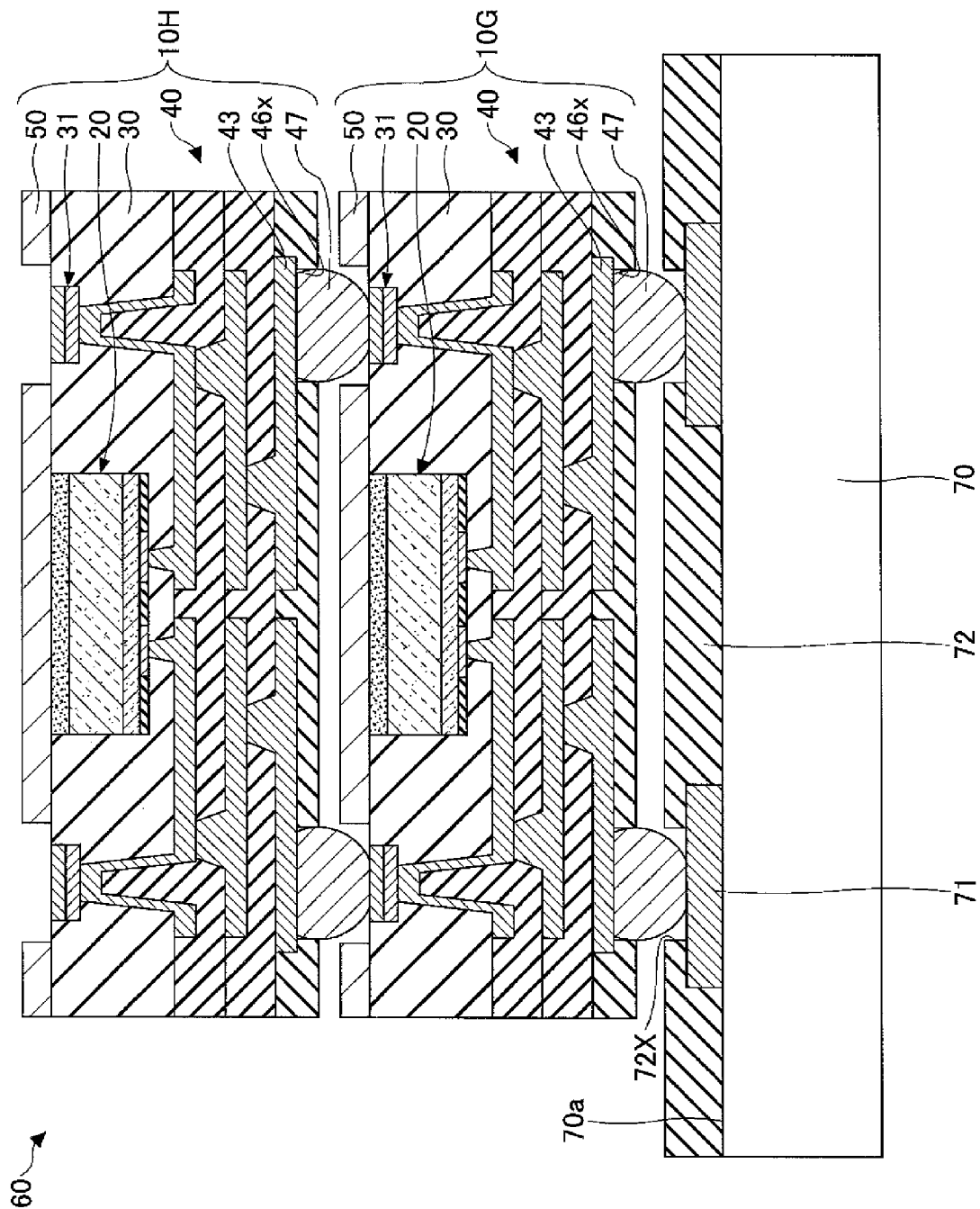
FIG. 42 illustrates a configuration of an electric part package according to a fifth embodiment of the present invention.

FIG. 42 is a cross-sectional view of an electric part package according to the fifth embodiment. As illustrated, an electric part package 60 includes electric part packages 10G, 10H. In addition, the electric part package 60 is mounted on a mounting substrate (a motherboard) 70.

Wiring layers 71 and a solder resist layer 72 are formed on a mounting surface 70a of the mounting substrate 70. The electric part package 60 is mounted on the mounting surface 70a. The wiring layers 71 are formed of, for example, copper or the like.

The solder resist layer 72 is formed on the mounting surface 70a of the mounting substrate 70 thereby to cover the wiring layers 71. The solder resist layer 72 includes openings 72x in which corresponding parts of the wiring layers 71 are exposed. The parts of the wiring layers 71 exposed in the corresponding openings 72x are used as electrode pads, which are electrically connected to the electric part package 10G.

The electric part package 10G has the same configuration as the electric part package 10 illustrated in FIG. 6. The electric part package 10G is mounted on the mounting surface 17a of the mounting substrate 70 so that a bottom surface of the electric part package 10G, the bottom surface corresponding to the surface of the wiring structure 40, opposes the mounting substrate 70, and the solder balls 47 are electrically connected to the corresponding parts of the wiring layers 71, exposed in the corresponding openings 72x of the solder resist layer 72.

The electric part package 10H has the same configuration as the electric part package 10 illustrated in FIG. 6. The electric part package 10H is mounted on the supporting member 50 of the electric part package 10G so that a bottom surface of the electric part package 10H, the bottom surface corresponding to the surface of the wiring structure 40, opposes the electric part package 10G, and the solder balls 47 are electrically connected to the electrode terminals 31 of the electric part package 10G. In other words, the solder balls 47 are located between the electric terminals 31 of the electric part package 10G, which is positioned below the electric part package 10H, and the third wiring layer 43 exposed in the openings 46x of the solder resist layer 46 of the electric part package 10H, so that the electric part packages 10G, 10H are electrically connected with each other by the solder balls 47.

As stated previously, because the supporting members 50 of the electric part packages 10G, 10H are not removed but remain therein, warpage of the electric part package 60, which may be caused by shrinkage differences, is reduced. In addition, because the semiconductor chips 20 and the resin parts 30 are supported by the corresponding supporting members 50, stiffness of the electric part package 60 can be enhanced. Moreover, when the supporting members 50 are formed of a material having a greater thermal conductivity than that of the resin parts 30, heat dissipation can be improved. Furthermore, if the supporting members 50 of the corresponding electric part packages 10G, 10H need to be entirely removed, a relatively large amount of, for example, etching solution for removing the supporting members 50 is required. However, because the supporting members 50 are not removed according to embodiments of the present invention, the etching solution and rinse solution can be saved, thereby leading to a reduced production cost.

Incidentally, the electric part package 60 may include various semiconductor chip packages, electric parts, or semiconductor chips, instead of one of the electric part packages 10G, 10H.

While the present invention has been explained with reference to the above preferred embodiments, the present invention is not limited to the disclosed embodiments, but various alterations and modifications may be applied without departing from the scope of the invention set forth in accompanying claims.

For example, the electric part 20 is not limited to the semiconductor chips 20, but may be various electric parts such as a chip capacitor, an inductor, or a resistor, instead of the semiconductor chip 20.

What is claimed is:

1. An electric part package comprising:
   a supporting member that includes a first area in which an electric part is arranged, and a second area in which a first opening is positioned, the second area being isolated from the first area, the supporting member comprising an electrically conductive material;
   a resin part provided on the supporting member thereby to cover the electric part arranged in the first area, the resin part including an electrode terminal exposed in the first opening of the supporting member; and
   a wiring structure electrically connected to the electric part and the electrode terminal of the resin part,
   wherein the wiring structure is provided on a first surface of the resin part and the electrode terminal is provided on a second surface of the resin part opposite to the first surface.

2. The electric part package of claim 1, wherein the supporting member further includes a second opening positioned in the first area, the second opening allowing an electrode pad of the electric part to be exposed therein.

3. The electric part package of claim 1, wherein the wiring structure comprises an insulating layer including a thermosetting resin containing a stiffener material.

4. The electric part package of claim 1, wherein the supporting member is covered with an insulating material.

5. The electric part package of claim 1, wherein:
   the electrode terminal includes first and second surfaces opposite to each other and a side surface connecting the first and second surfaces, and
   the first surface and the side surface are covered with the resin part and the second surface is exposed from the resin part.

6. The electric part package of claim 1, wherein a first via hole that exposes an electrode pad of the electric part and a second via hole that exposes a surface of the electrode terminal are provided in the resin part from the first surface thereof.

7. The electric part package of claim 6, wherein the wiring structure includes a wiring layer that is electrically connected with the electrode pad through the first via hole and with the electrode terminal through the second via hole.

* * * * *